(12) United States Patent
Takei et al.

(10) Patent No.: US 8,847,278 B2
(45) Date of Patent: Sep. 30, 2014

(54) SEMICONDUCTOR DEVICE COMPRISING A BREAKDOWN WITHSTANDING SECTION

(75) Inventors: Manabu Takei, Shiojiri (JP); Yusuke Kobayashi, Matsumoto (JP)

(73) Assignee: Fuji Electric Co., Ltd., Kawasaki-Shi (JP)

(*) Notice: Subject to any disclaimer, the term of this patent is extended or adjusted under 35 U.S.C. 154(b) by 0 days.

(21) Appl. No.: 13/640,481

(22) PCT Filed: Jan. 16, 2012

(86) PCT No.: PCT/JP2012/050759
§ 371 (c)(1),
(2), (4) Date: Dec. 10, 2012

(87) PCT Pub. No.: WO2012/099079
PCT Pub. Date: Jul. 26, 2012

(65) Prior Publication Data
US 2013/0075819 A1    Mar. 28, 2013

(30) Foreign Application Priority Data

Jan. 17, 2011  (JP) ................................. 2011-006691
Apr. 18, 2011  (JP) ................................. 2011-091990

(51) Int. Cl.

| | | |
|---|---|---|
| H01L 29/74 | (2006.01) | |
| H01L 29/02 | (2006.01) | |
| H01L 29/66 | (2006.01) | |
| H01L 27/06 | (2006.01) | |
| H01L 21/02 | (2006.01) | |
| H01L 29/78 | (2006.01) | |
| H01L 29/06 | (2006.01) | |
| H01L 29/40 | (2006.01) | |
| H01L 29/739 | (2006.01) | |
| H01L 21/332 | (2006.01) | |

(52) U.S. Cl.
CPC .......... *H01L 29/78* (2013.01); *H01L 21/02107* (2013.01); *H01L 29/0619* (2013.01); *H01L 29/66348* (2013.01); *H01L 29/404* (2013.01); *H01L 29/0661* (2013.01); *H01L 29/7395* (2013.01)

USPC .......... 257/170; 257/127; 257/129; 257/171; 257/335; 257/336; 257/339; 257/367; 257/370; 257/378; 257/409; 257/586; 438/133; 438/134; 438/135; 438/136; 438/137; 438/138; 438/139; 438/140

(58) Field of Classification Search
None
See application file for complete search history.

(56) References Cited

U.S. PATENT DOCUMENTS

| | | | |
|---|---|---|---|
| 5,432,370 A | 7/1995 | Kitamura et al. | |
| 2002/0063300 A1 | 5/2002 | Miyajima | |
| 2005/0056912 A1* | 3/2005 | Ninomiya et al. | ............ 257/565 |
| 2007/0052014 A1* | 3/2007 | Takahashi | ...................... 257/330 |
| 2008/0001217 A1* | 1/2008 | Kawashima | .................. 257/330 |

(Continued)

FOREIGN PATENT DOCUMENTS

| | | |
|---|---|---|
| JP | 06-120510 A | 4/1994 |
| JP | 09-283754 A | 10/1997 |

(Continued)

*Primary Examiner* — Mamadou Diallo
*Assistant Examiner* — Jay C Chang
(74) *Attorney, Agent, or Firm* — Rabin & Berdo, P.C.

(57) ABSTRACT

A semiconductor device includes an active section for a main current flow and a breakdown withstanding section for breakdown voltage. An external peripheral portion surrounds the active section on one major surface of an n-type semiconductor substrate. The breakdown withstanding section has a ring-shaped semiconductor protrusion, with a rectangular planar pattern including a curved section in each of four corners thereof, as a guard ring. The ring-shaped semiconductor protrusion has a p-type region therein, is sandwiched between a plurality of concavities deeper than the p-type region, and has an electrically conductive film across an insulator film on the surface thereof. Because of this, it is possible to manufacture at low cost a breakdown withstanding structure with which a high breakdown voltage is obtained in a narrow width, wherein there is little drop in breakdown voltage, even when there are variations in a patterning process of a field oxide film.

18 Claims, 21 Drawing Sheets

(56) References Cited

U.S. PATENT DOCUMENTS

| | | |
|---|---|---|
| 2010/0140657 A1 | 6/2010 | Takei |
| 2010/0230745 A1 | 9/2010 | Saito et al. |
| 2010/0289110 A1 | 11/2010 | Tarui et al. |

FOREIGN PATENT DOCUMENTS

| | | |
|---|---|---|
| JP | 11-087698 A | 3/1999 |
| JP | 2002-164541 A | 6/2002 |
| JP | 2005-223349 A | 8/2005 |
| JP | 2007-059766 A | 3/2007 |
| JP | 2009-099863 A | 5/2009 |
| JP | 2010-141310 A | 6/2010 |
| JP | 2010-219224 A | 9/2010 |
| JP | 2010-225833 A | 10/2010 |
| JP | 2010-267655 A | 11/2010 |
| JP | 2011-003727 A | 1/2011 |

* cited by examiner

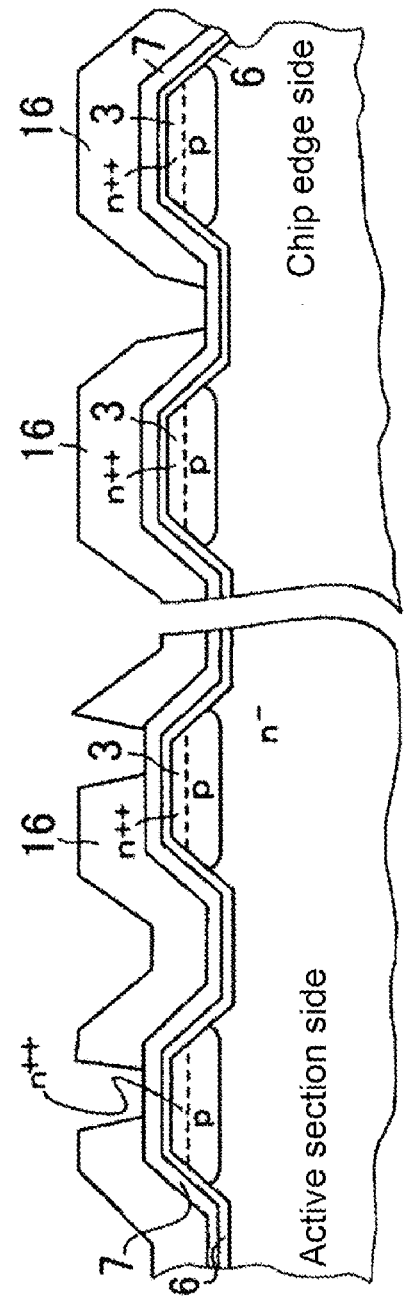

SEMICONDUCTOR DEVICE COMPRISING A BREAKDOWN WITHSTANDING SECTION

CROSS-REFERENCE TO RELATED APPLICATIONS

This application is the national phase of international application number PCT/JP2012/050759, filed Jan. 16, 2012, and claims the benefit of priority of Japanese patent applications JP PA 2011-006691, filed Jan. 17, 2011, and JP PA 2011-091990, filed Apr. 18, 2011. The disclosures of the international application and the Japanese priority applications are incorporated herein by reference.

BACKGROUND

1. Technical Field

The present invention relates to power semiconductor devices used in electric power converters and the like. Specifically, the invention relates to MOS-type semiconductor devices such as IGBT and a manufacturing method thereof.

2. Background Art

A description will be given of a breakdown withstanding section in a heretofore known power semiconductor device. FIG. 2 is a cross sectional view of a breakdown withstanding section having guard rings in a heretofore known semiconductor device. In FIG. 2, a breakdown withstanding section 200 in a power semiconductor device 300 is usually arranged in a chip edge area surrounding an active section 100 that engages in making a main current flow in a conductive state of the power semiconductor device 300.

Usually, it is often the case that a guard ring structure, wherein a plurality of p-type semiconductor diffusion regions of opposite polarity (abbreviated to p-type regions 31) are arranged so as to form a planar ring pattern in a surface portion of an n-type semiconductor substrate 30, is employed in the breakdown withstanding section 200 in the kind of high breakdown voltage power semiconductor device 300 shown in FIG. 2.

The p-type regions 31 configuring the guard ring structure are formed by selective boron ion implantation from a semiconductor substrate 30 surface and by thermal diffusion. Therefore, a pn-junction portion that constitutes a boundary between the n-type semiconductor substrate 30 and the p-type region 31 (hereinafter referred to as "the boundary-constituting pn-junction portion") forms a U-shaped cross section with the substrate surface as a terminus portion.

As a result, a curved section 32 indicating an equipotential curve distribution of a depletion layer spreading from the boundary-constituting pn-junction portion when an OFF-voltage is applied is formed following a U-shaped curved portion of the boundary-constituting pn-junction portion. The electric field localization in the curved section 32 is relaxed by the guard ring structure with this kind of configuration, but the electric field relaxation is not always sufficient, and a drop in breakdown voltage may be unavoidable.

Also, in the selective thermal diffusion of impurity atoms into the semiconductor substrate, a diffusion region is formed by the impurity atoms diffusing to expand in the vertical and lateral directions into the semiconductor substrate from an opening area in the semiconductor substrate surface or from an ion-implanted region. As the diffusion region expands not only in the depth direction but also in the lateral directions, the width of the impurity atom spread is greater than that of the opening area at the start of the selective thermal diffusion of the impurity atoms into the semiconductor substrate.

For improving the breakdown voltage and the reliability thereof, a thick oxide film (a field oxide film 33) with a thickness of 5000 angstroms (Å) or more is usually formed on the surface of the breakdown withstanding section 200 of the semiconductor substrate. Furthermore, in some cases, a configuration that makes an electrically conductive polysilicon layer or an electrically conductive film formed on the field oxide film 33 as a field plate 34 that exhibits an electric field relaxation function is adopted.

When an IGBT is considered specifically as the power semiconductor device 300 that includes the breakdown withstanding section 200, the IGBT is brought into an ON-state when a voltage of a predetermined threshold value or higher is applied to a gate electrode in a MOS structure in the active section 100. Surface electron layers, such as an inversion layer (n-channel) induced in a surface portion of a p-type base region of a silicon semiconductor substrate opposing the gate electrode via a gate oxide film and a storage layer induced in a surface portion of an n-type layer, an n-type drift layer, a collector junction, a p-type collector layer, and the like, exist in a current path when the IGBT is in the ON-state. An ON-voltage is obtained by summing up voltage drop values along the ON-state current path.

For reducing the ON-voltage, a shortening of the distance (width) in the electron flow direction in the surface electron layer, that is, a channel shortening, and an increasing of current density by shortening a pitch of a unit cell, which is one unit of a plurality of MOS structures distributed uniformly in a surface portion of the active section, are effective. The shortening of the cell pitch, which increases the cell density in a unit area and reduces the voltage drop value across the surface electron layer in each unit cell, is effective in reducing the ON-voltage.

However, when the carrier (electron, hole) concentration in the drift layer increases, the turnoff loss increases. In other words, there exists a tradeoff relation between the ON-voltage and the turnoff loss. Therefore, it is not sufficient to design the power semiconductor device 300 including the breakdown withstanding section 200, like the IGBT, considering ON-voltage reduction only.

When turning off, a depletion layer expands from the junction on the surface side, and carriers on the surface side are swept out first. That is, the carriers on the surface side are swept out when a bias voltage between a collector and an emitter is relatively low. Because of this, the turnoff loss caused until the carriers on the surface side are swept out, and represented by the product of a voltage and a current, becomes low. Therefore, by considering a structure in which the front-surface-side carrier concentration is higher than the back-surface-side carrier concentration, it is possible to reduce the turnoff loss at the same ON-voltage.

In the newest IGBT's, the carrier concentration in the ON-state of the device is distributed almost flatly, meaning that, by further increasing the carrier concentration on the emitter side, it is possible to further improve the tradeoff relation. In other words, the IGBT's in the present state do not exhibit the IE effect (that is the injection enhancement effect) fully. For further increasing the surface carrier concentration, it is effective to reduce the area of the p-type base region that works as a carrier absorbing layer. With a trench-gate structure mainly employed these days, as it is possible to reduce the p-type base region area at the same channel width as compared with a planar-gate structure, the IE effect is greater.

Regarding the semiconductor devices that exhibit a low ON-voltage, prevent the electric field from localizing, and can increase breakdown voltage, such as that previously described, various means, such as including a guard ring including a protruding semiconductor region in the breakdown withstanding section surface, or a guard ring having a RESURF structure, have already been disclosed (for example, refer to Patent Documents 1 and 2, identified below).

There has been disclosed a document in which is described a device wherein, using a low-cost manufacturing process and with high throughput of non-defective products, the IE effect is large, the ON-voltage is low, and it is possible to obtain a higher breakdown voltage by preventing the electric field from localizing (for example, refer to Patent Document 3, identified below).

RELATED ART DOCUMENTS

Patent Documents

Patent Document 1: JP-A-2010-141310 (Paragraph 0008)
Patent Document 2: JP-A-2002-164541 (FIG. 7)
Patent Document 3: JP-A-2011-003727 (Paragraph 0005)

However, the field oxide film 33 thickness sometimes affects breakdown voltage performance in the breakdown withstanding section 200. For example, when the field oxide film 33 is thin, the field plate 34 will exhibit large functions and effects. Also, for example, when the field oxide film 33 is thin, the field plate 34 functions to make it easier for the local electric field strength to change greatly depending on the distance for which the field plate 34 extends onto the substrate surface. In this way, with the heretofore known technology, when the field oxide film 33 thickness is caused to be thin by the variations caused in the manufacturing process, especially by the variations caused in the steps of patterning and etching the oxide film, there is a problem in that the breakdown voltage performance will be affected greatly.

Also, when the thick field oxide film 33 is used with the heretofore known technology, there is a problem in that the breakdown voltage performance will inevitably drop, although not affected so much as when the field oxide film 33 is thin, since there are process variations. For suppressing the drop in the breakdown voltage performance due to the process variations to the minimum thereof, to date, predetermined unavoidable ranges of process variations have been considered in advance, and a redundant design that considers the process variations is adopted, but in this case, the breakdown withstanding section 200 will be large in width, the chip size will be large, and there is a problem in that manufacturing costs will soar. Furthermore, when the thick field oxide film 33 is used with the heretofore known technology, the period of time necessary for growing the oxide film also increases, and there is problem in that processing costs increase because of this too.

As for the active section 100, the trench-gate structure, which can increase the channel density and is effective in lowering the ON-voltage has a long and complicated manufacturing process, and there is a problem in that manufacturing costs increase. Also, when the active section 100 is further reduced in order to further improve the characteristics, there is a problem in that the manufacturing costs will only increase.

Also, since the electric field is liable to localize to a trench bottom and an avalanche breakdown is liable to occur in the trench-gate structure, there is a problem in that the breakdown voltage is liable to drop. For securing a sufficient breakdown voltage in the gate oxide film in a trench corner of the trench-gate structure, it is necessary to thicken the oxide film. However, when the oxide film is thick, the oxide film capacitance decreases, and when the oxide film capacitance is small, there is a relationship such that few electric charges are induced when a voltage is applied to the oxide film.

Since the electric charges induced on the silicon side of the oxide film are electrons of the storage layer, the electron concentration in the storage layer decreases, the voltage drop increases, and the ON-voltage rises. As another method for improving the IE effect in the trench-gate structure, there is a method whereby the trench is further deepened, but when the trench is further deepened, the trench side wall area increases, the capacitance between the gate and the collector increases, and there is a problem in that switching operations slow down.

SUMMARY

The invention, having been contrived bearing in mind the heretofore described points, has an object of providing a semiconductor device, and a manufacturing method thereof, with which it is possible to manufacture at low cost a breakdown withstanding section wherein there is little drop in breakdown voltage, and a high breakdown voltage is obtained in a narrow width, even when there are variations in a patterning process of a field oxide film. Also, the invention has an object of providing a semiconductor device, and a manufacturing method thereof, wherein the IE effect is large and an ON-voltage low, using a low-cost manufacturing process.

The objects of the invention are achieved by adopting a semiconductor device including an active section engaged in making a main current flow and a breakdown withstanding section, engaged in breakdown voltage, disposed in an external peripheral portion surrounding the active section on one major surface of an n-type semiconductor substrate, wherein the breakdown withstanding section has a ring-shaped semiconductor protrusion, with a rectangular planar pattern including a curved section in each of four corners thereof, as a guard ring, the ring-shaped semiconductor protrusion has a p-type region therein, is sandwiched between a plurality of concavities deeper than the p-type region and, the difference in height between the ring-shaped semiconductor protrusion and the concavities being less than 2 μm, has an electrically conductive film across an insulator film on the surface thereof.

In the semiconductor device of the invention according to the heretofore described aspect thereof, it is preferable that the insulator film is 0.5 μm or less in thickness.

Also, in the semiconductor device of the invention according to the heretofore described aspect thereof, it is preferable that the insulator film on the ring-shaped semiconductor protrusion surface is an oxide film, and the electrically conductive film is an electrically conductive polysilicon layer.

Also, in the semiconductor device of the invention according to the heretofore described aspect thereof, it is preferable that the oxide film on the ring-shaped semiconductor protrusion surface is formed simultaneously with forming a gate oxide film in the active section.

Also, it is preferable that the semiconductor device of the invention according to the heretofore described aspect thereof includes, in the curved section in the four corners of the ring-shaped semiconductor protrusion, a structure wherein a metal electrode unitary with a main electrode on the active section contacts electrically with the electrically conductive polysilicon layer via an opening provided in an interlayer insulator film covering the electrically conductive polysilicon layer, and further contacts electrically with the n-type semiconductor substrate via an opening provided in the electrically conductive polysilicon layer under the opening and in the underlaying insulator film.

Also, in the semiconductor device of the invention according to the heretofore described aspect thereof, it is preferable that the metal electrode is an alloy electrode containing aluminum as a main component thereof.

Also, it is preferable that the semiconductor device of the invention according to the heretofore described aspect thereof includes a p-type region of a low impurity concentration with a dose amount between $1\times10^{11}$ cm$^{-2}$ and $1\times10^{13}$ cm$^{-2}$ in the bottom of the plurality of concavities sandwiching the ring-shaped semiconductor protrusion.

Also, in the semiconductor device of the invention according to the heretofore described aspect thereof, it is preferable that a plurality of the ring-shaped semiconductor protrusions are arranged with an equal space therebetween, the electrically conductive films on the ring-shaped semiconductor protrusions are arranged with a space different from the space therebetween, and the arrangement of the electrically conductive films is such that the pitch of the space is made to be narrower than the pitch of the space of the ring-shaped semiconductor protrusions by a predetermined width from the chip edge to the chip center with the innermost position of the breakdown withstanding section as a reference.

Also, in the semiconductor device of the invention according to the heretofore described aspect thereof, it is preferable that the ring-shaped semiconductor protrusion that includes the p-type region therein further includes an n-type region.

Also, in the semiconductor device of the invention according to the heretofore described aspect thereof, it is preferable that, of a plurality of concavities and convexities distributed uniformly in the active section, the convexity includes a MOS structure including an underlying p-type base region, an n-type emitter region with a high impurity concentration on the base region, and a gate electrode above the side surface of the p-type base region exposed to the side wall of the convexity across a gate insulator film, the active section further includes an n-type region in the bottom of the concavity, and the total flat top area of the MOS structure in the convexity is smaller than the bottom area of the concavity of the active section.

Also, in the semiconductor device of the invention according to the heretofore described aspect thereof, it is preferable that a MOS structure region of the convexity is less than 2 µm in height. Furthermore, it is preferable that the angle between the surface and side wall of the MOS structure region of the convexity is 150 degrees or narrower.

Also, it is preferable that the invention is a semiconductor device manufacturing method including, after an etching step of forming a breakdown withstanding section, arranged in a rectangular planar pattern including a curved section in each of four corners thereof in an external peripheral portion surrounding an active section on one major surface of an n-type semiconductor substrate, into a concavity and a convexity, with the ring-shaped semiconductor protrusion as the convexity, forming a resist film by spinner coating for setting a resist film thickness T1 on the convexity to be thinner than a resist film thickness T2 on the bottom of the concavity, and conducting a photolithographic step of forming a resist film pattern, in which an opening width W2 on the bottom of the concavity is wider than an opening width W1 in the resist film above the convexity and the resist opening width W2 of the concavity in the curved section is wider than the resist opening width W1 in the straight section.

Also, it is preferable that the invention is a semiconductor device manufacturing method including, after an etching step of forming a breakdown withstanding section, arranged in a rectangular planar pattern including a curved section in each of four corners thereof in an external peripheral portion surrounding an active section on one major surface of an n-type semiconductor substrate, into a concavity and a convexity, with the ring-shaped semiconductor protrusion as the convexity, setting a resist film thickness T2 on the bottom of the concavity to be two times or more as large as the height of the convexity when spinner coating a resist film so that a resist film thickness T1 on the convexity is thinner than the resist film thickness T2 on the bottom of the concavity.

According to the invention, it is possible to provide a semiconductor device, and a manufacturing method thereof, with which it is possible to manufacture at low cost a high breakdown voltage breakdown withstanding section wherein there is little drop in breakdown voltage, and the width of the breakdown withstanding section is small, even when there are variations in a patterning process of a field oxide film.

Also, according to the invention, it is possible to provide a semiconductor device, and a manufacturing method thereof, wherein the IE effect is large and an ON-voltage low, using a low-cost manufacturing process.

BRIEF DESCRIPTION OF THE DRAWINGS

FIG. 21 is a cross sectional view of a breakdown withstanding section spray coated with a resist.

DETAILED DESCRIPTION

Hereinafter, a detailed description will be given, with reference to the drawings, of embodiments of a semiconductor device according to the invention. Provided that the scope of the invention is not exceeded, the invention is not limited to the statements in the embodiments described hereinafter.

First Embodiment

Figure 1:
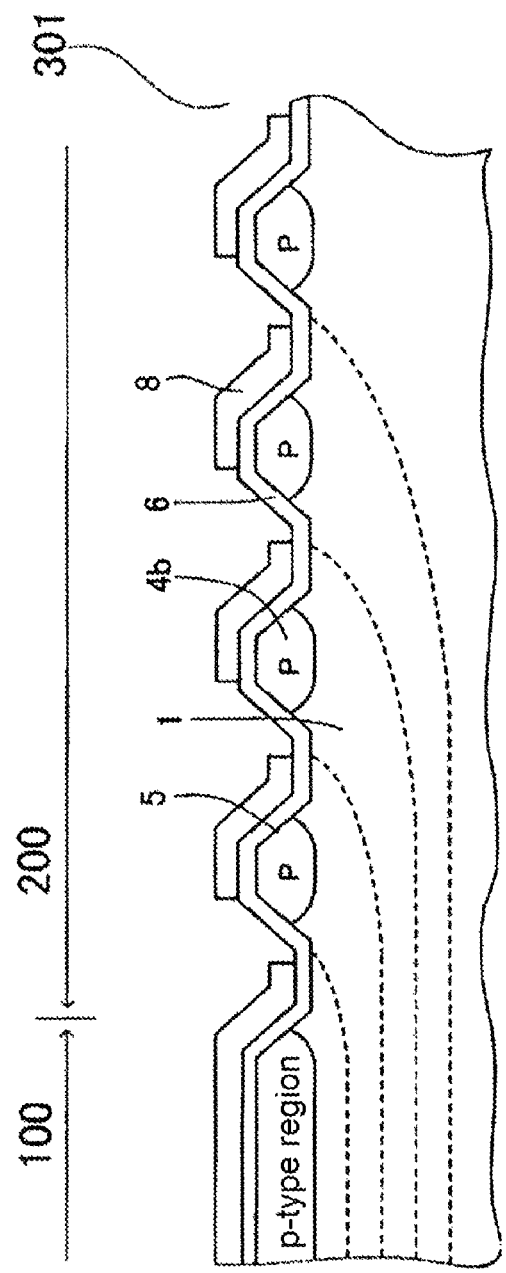
FIG. 1 is a cross sectional view of a breakdown withstanding section including guard rings in an IGBT according to a first embodiment of a semiconductor device of the invention along the single-dotted chain line A-A in FIG. 11.
Figure 2:
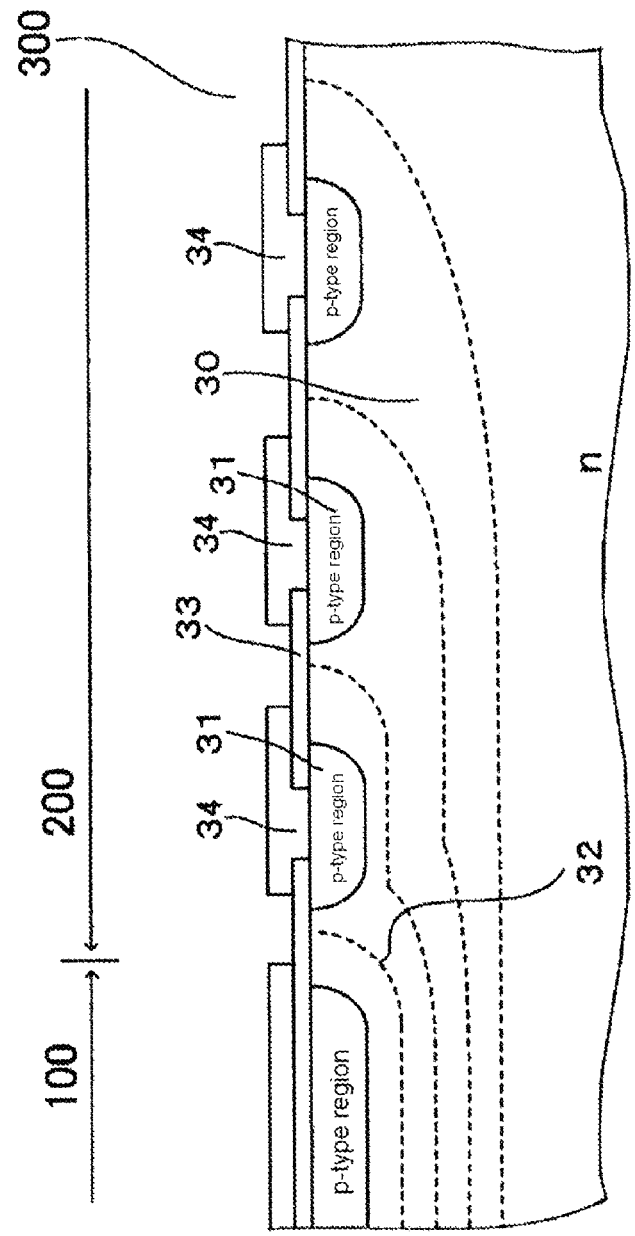
FIG. 2 is a cross sectional view of a breakdown withstanding section including guard rings in a conventional power semiconductor device.
Figure 11:
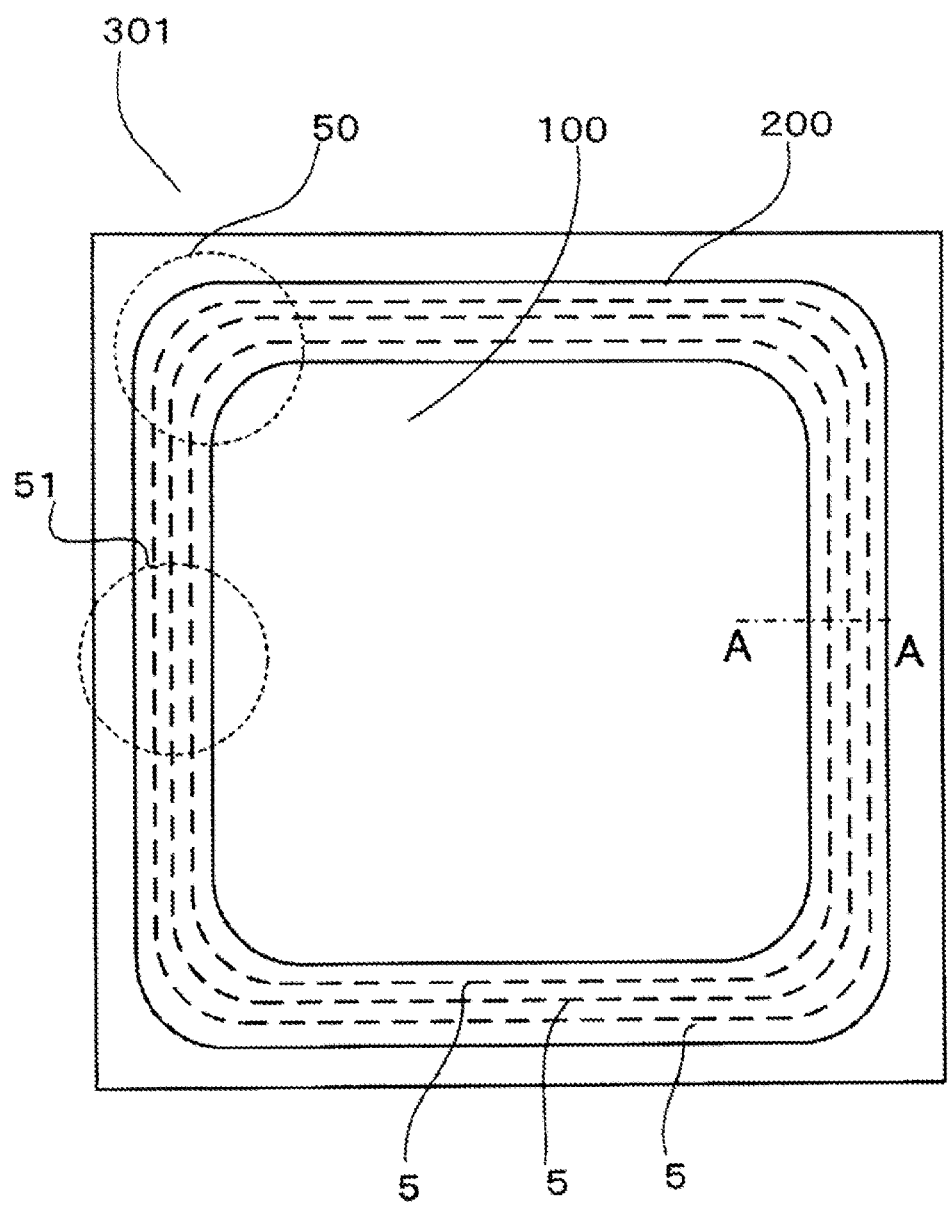
FIG. 11 is a top plan view of the breakdown withstanding section including the guard rings in the IGBT according to the first embodiment of the semiconductor device of the invention.

Now a semiconductor device according to a first embodiment of the invention will be described below. FIG. 11 is a top plan view of an IGBT of the semiconductor device according to the first embodiment of the invention. FIG. 1 is a cross sectional view of a breakdown withstanding section including guard rings in the IGBT according to the first embodiment of the semiconductor device of the invention along the single-dotted chain line A-A in FIG. 11.

In FIG. 11 and FIG. 1, an IGBT 301 according to the first embodiment of the semiconductor device of the invention includes an active section 100, through which a current flows in a conductive state (an ON-state), and a breakdown withstanding section 200, disposed so as to surround the active section 100 periphery, that sustains a voltage when the current is interrupted (in an OFF-state). The detailed structure in the active section 100 includes an emitter electrode and a gate electrode pad. As the detailed structure in the active section 100 is not related directly with the first embodiment, it is omitted from the drawings.

The breakdown withstanding section 200 in the periphery surrounding the active section 100 is shaped with an almost rectangular shape in a planar pattern thereof in accordance with the rectangular of the IGBT 301. Four corners of the breakdown withstanding section 200 are shaped with a curve as shown in curved sections 50 to avoid a breakdown voltage drop caused in the breakdown withstanding section 200 by electric field localization.

The breakdown withstanding section 200 includes ring-shaped p-type semiconductor layers formed in a planar pattern surrounding the periphery of the active section 100. The p-type semiconductor layers include a p-type semiconductor layer formed in the preceding step and a ring-shaped semiconductor protrusion 5 (shown by a broken curve in FIG. 11) remaining after a not-shown n-type semiconductor layer is etched selectively from the surface thereof to a depth deep enough to expose an n-type semiconductor substrate 1 (n-type drift layer) (or to a depth deeper than the p-type semiconductor layer), such that an etched away portion has a concave cross section.

The step height between the ring-shaped semiconductor protrusion 5 and a concavity formed between the ring-shaped semiconductor protrusions 5 is set to be less than 2 µm. Therefore, in the cross section of the breakdown withstanding section 200, the concavity formed by etching and the ring-shaped semiconductor protrusion 5 have a form wherein they are arranged alternately, as shown in FIG. 1. A step height equal to or more than 2 µm is not preferable, since the patterning accuracy by the photolithography is impaired. The ring-shaped semiconductor protrusion 5 works as a guard ring. Also, as shown in FIG. 11, the breakdown withstanding section 200 has a planar pattern including four straight sections 51 and the curved sections 50 formed in the areas in which the straight sections 51 cross.

Now a manufacturing process of the FS-type IGBT 301 according to the invention will be described. FIG. 7, FIG. 8, FIG. 9, and FIG. 10 are cross sectional views of the breakdown withstanding section in a main manufacturing step of the 1200V FS-type IGBT according to the first embodiment of the semiconductor device of the invention. FIG. 7 to FIG. 10 show partial cross sectional views of the breakdown withstanding section 200 of the 1200V FS-type IGBT (an FS-type IGBT with a rated breakdown voltage of 1200V) 301 according to the invention.

Figure 10:
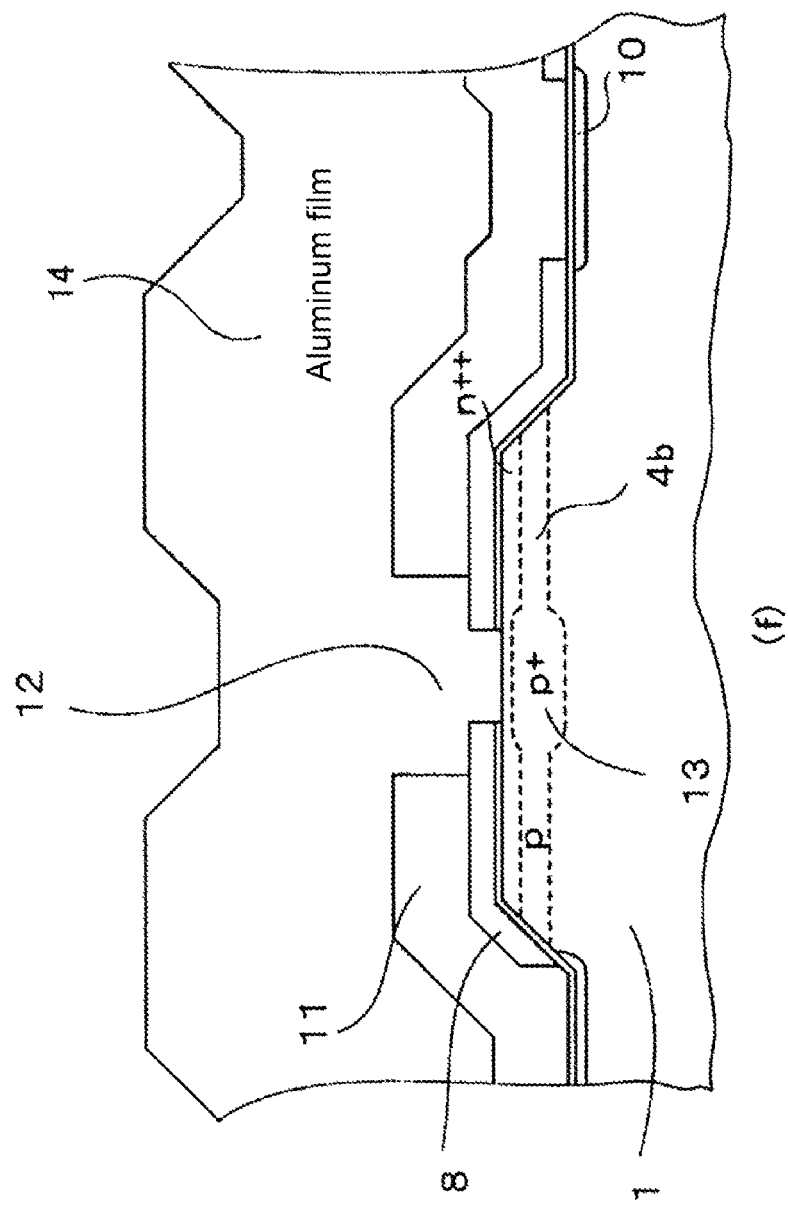
FIG. 10 is a (fourth) cross sectional view of the breakdown withstanding section in the main manufacturing step of the 1200V FS-type IGBT according to the first embodiment of the semiconductor device of the invention.

FIG. 10 shows, in particular, a cross section of the breakdown withstanding section in a chip corner after, of the main manufacturing steps of the 1200V FS-type IGBT according to the first embodiment of the semiconductor device of the invention, a formation of an aluminum electrode by sputtering. The FS-type IGBT 301, which is the semiconductor device of the first embodiment according to the invention, has as a material the n-type FZ silicon semiconductor substrate 1 (designated as n⁻ in FIG. 7. Hereinafter referred to as the "semiconductor substrate 1"), the major surface of which is a (100) plane and the resistivity of which is 60 Ωcm.

Figure 7:
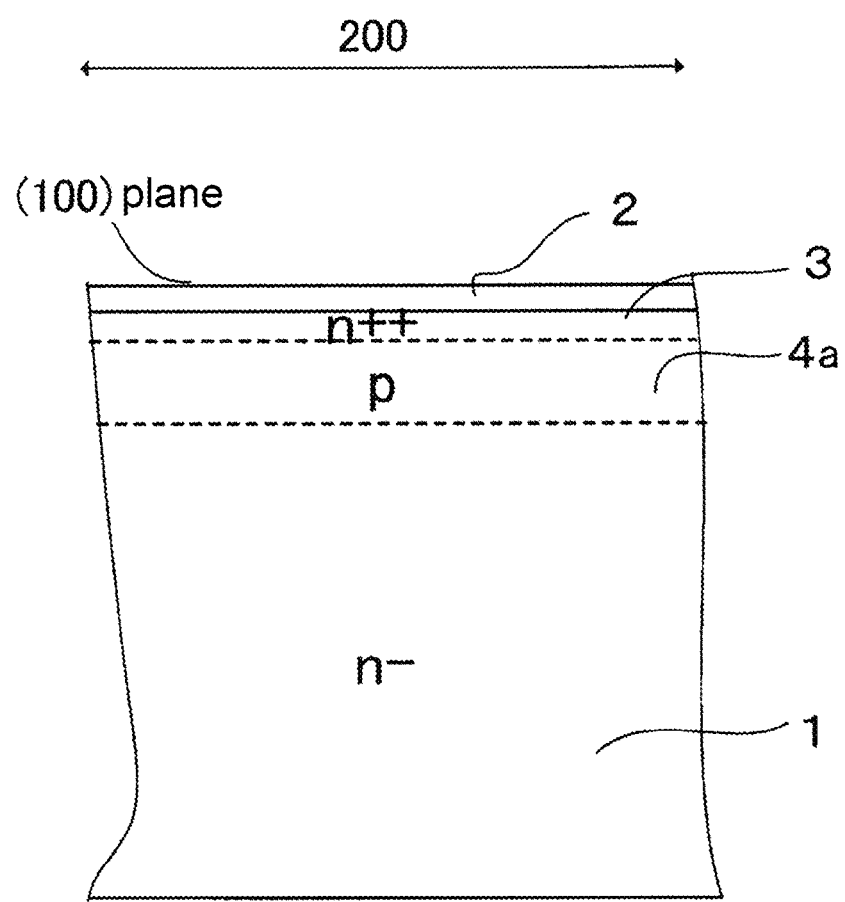
FIG. 7 is a (first) cross sectional view of the breakdown withstanding section in a main manufacturing step of the 1200V FS-type IGBT according to the first embodiment of the semiconductor device of the invention.

Firstly, as described in FIG. 7, a thermal oxide film 2, 350 angstroms (Å) in thickness, is grown on one surface side of the semiconductor substrate 1, and arsenic ions are implanted through the entire surface on the one surface side of the semiconductor substrate 1 on which the thermal oxide film 2 has been grown, at a dose amount of $4.0\times10^{15}$ cm$^{-2}$ and at an acceleration energy of 80 keV, to form an n-type emitter layer 3 (designated as n$^{++}$ in FIG. 7). Although it is not necessary for the breakdown withstanding section 200 to include the n-type emitter layer 3, the n-type emitter layer 3 is necessary for forming a MOS structure in the active section 100, and is therefore formed in the entire surface. Because of this, the n-type emitter layer 3 is formed also in the breakdown withstanding section 200. After forming the n-type emitter layer 3, the entire thermal oxide film 2 is removed, and the semiconductor substrate 1 is annealed in an oxygen atmosphere to recover crystal defects and to form a screen oxide film simultaneously.

Next, boron ions are implanted, at a dose amount of $1.0\times10^{14}$ cm$^{-2}$ and at an acceleration energy of 150 keV, into the one surface side of the semiconductor substrate 1 annealed in the oxygen atmosphere after the entire thermal oxide film 2 is removed to form a p-type base region around 1.0 μm in thickness. The p-type base region around 1.0 μm in thickness forms a p-type semiconductor layer 4a in the breakdown withstanding section 200.

Figure 8:
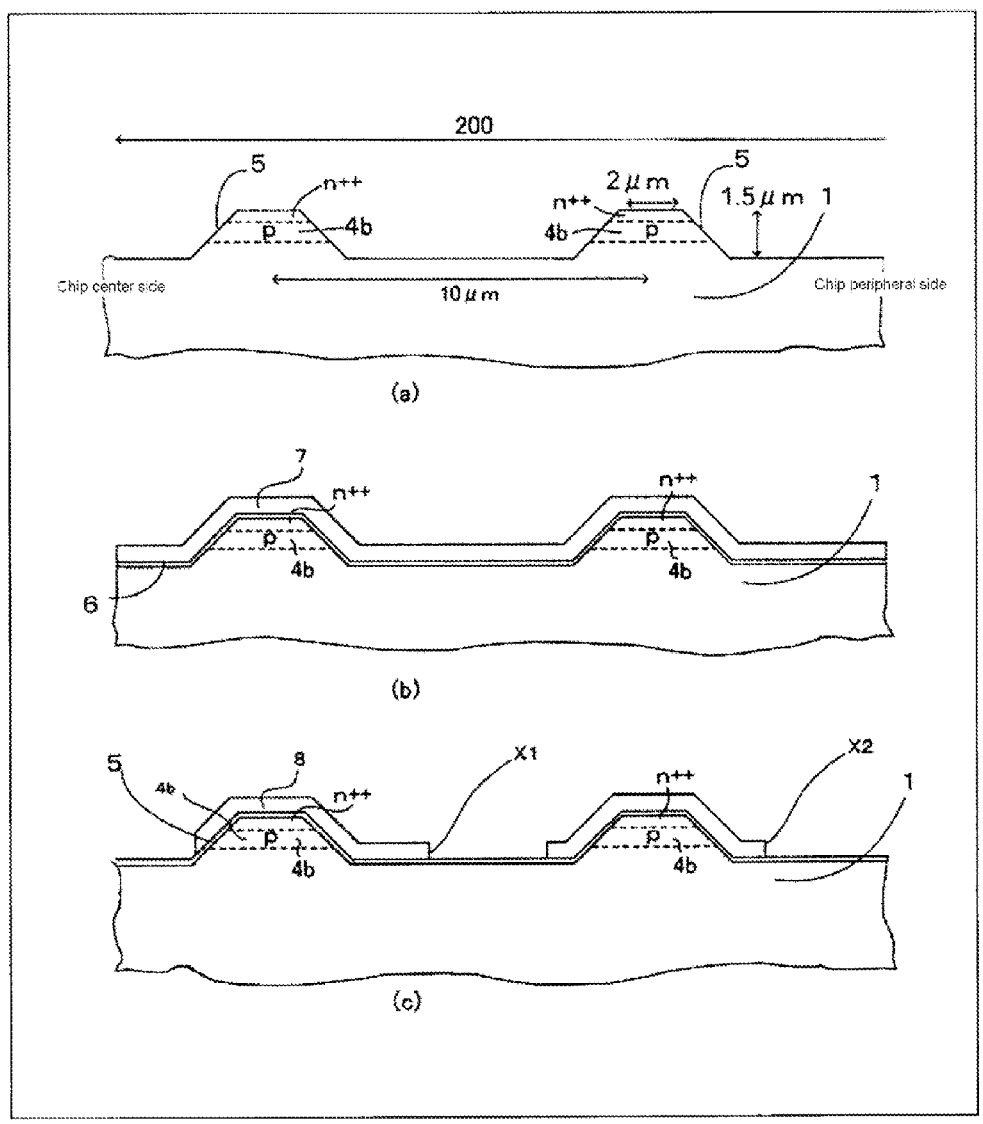
FIG. 8 is (second) cross sectional views of the breakdown withstanding section in the main manufacturing step of the 1200V FS-type IGBT according to the first embodiment of the semiconductor device of the invention.
Figure 9:
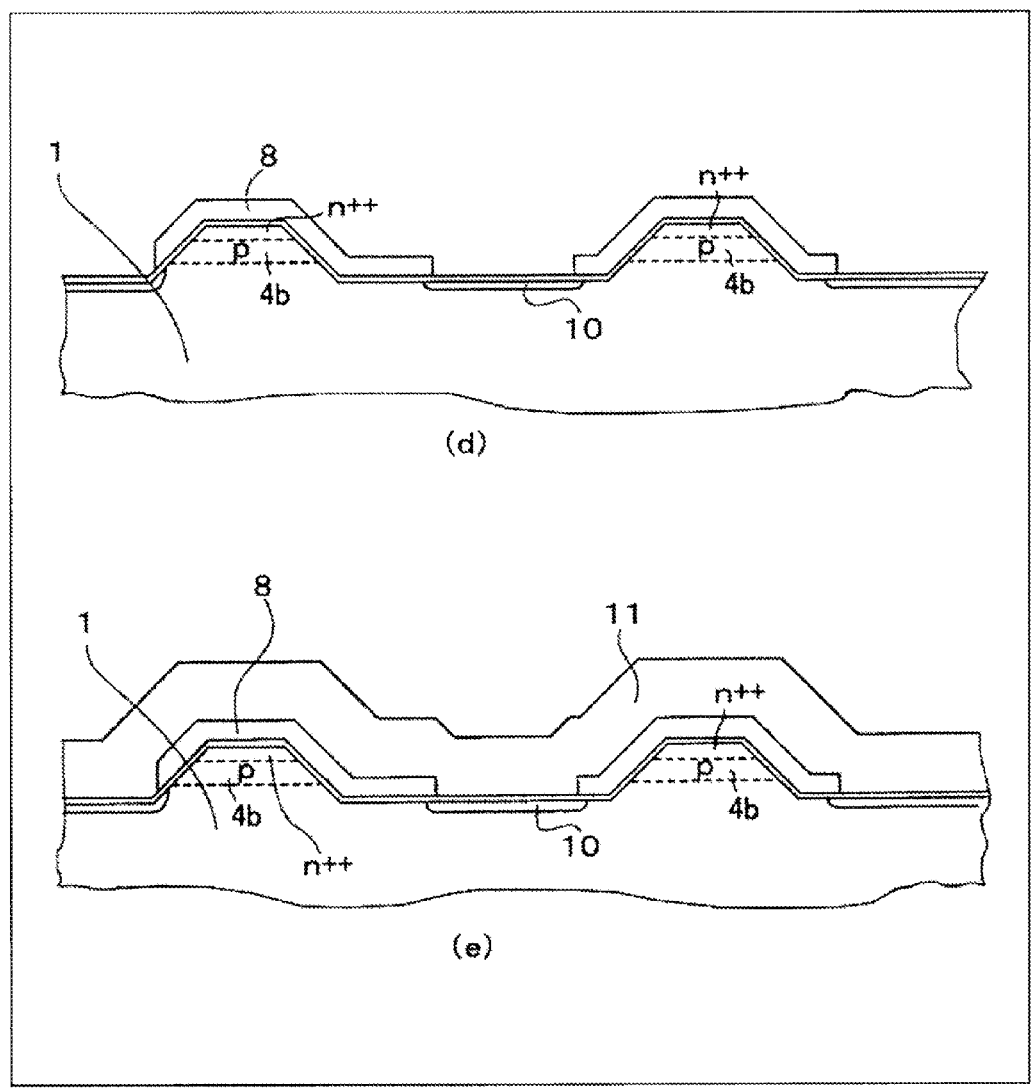
FIG. 9 is (third) cross sectional views of the breakdown withstanding section in the main manufacturing step of the 1200V FS-type IGBT according to the first embodiment of the semiconductor device of the invention.

After forming the p-type base region around 1.0 μm in thickness, the oxide film 2 is removed entirely, as shown in FIG. 8. After removing the entire oxide film 2, a plurality of stripe-shaped resist films (not shown) 5 μm in width are formed by patterning on the breakdown withstanding section 200 at a pitch of 10 μm (as indicated by a double-headed arrow) with an equal space left between the stripe-shaped resist films. Then, using the stripe-shaped resist films for a mask, the semiconductor substrate 1 is dug from the surface thereof in an isotropic manner to a depth of 1.5 μm by etching with a plasma etcher.

The P-type region 4b remaining after the etching is lower than the etching depth of 1.5 μm. Because of this, after the removal of the stripe-shaped resist films, there is formed a structure in which exist some ring-shaped semiconductor protrusions 5 having a planar pattern of stripes, each 2 μm in width, when looking at the semiconductor substrate 1 from above, with an equal space left therebetween, between the concavities of a depth of less than 2 μm to which the semiconductor substrate 1 is exposed (FIG. 8(a)). The ring-shaped semiconductor protrusions 5 having a planar stripe pattern work as p-type guard rings.

The N-type semiconductor substrate 1 is exposed to the concavity bottom between the guard rings, as previously described. Because of this, the p-type region 4b in the protruding guard ring is positioned at an elevation higher than the concavity surface in the semiconductor substrate 1. Therefore, when an electrically conductive field plate 8 is in combination with the p-type region 4b such that the electrically conductive field plate 8 is positioned to cover the p-type region 4b appropriately, as shown in the cross sectional view of the breakdown withstanding section 200 of the IGBT 301 of FIG. 1, it is possible to reduce the curvatures of equipotential curves liable to cause electric field localization thereto when a reverse voltage is applied to a pn-junction.

Figure 3:
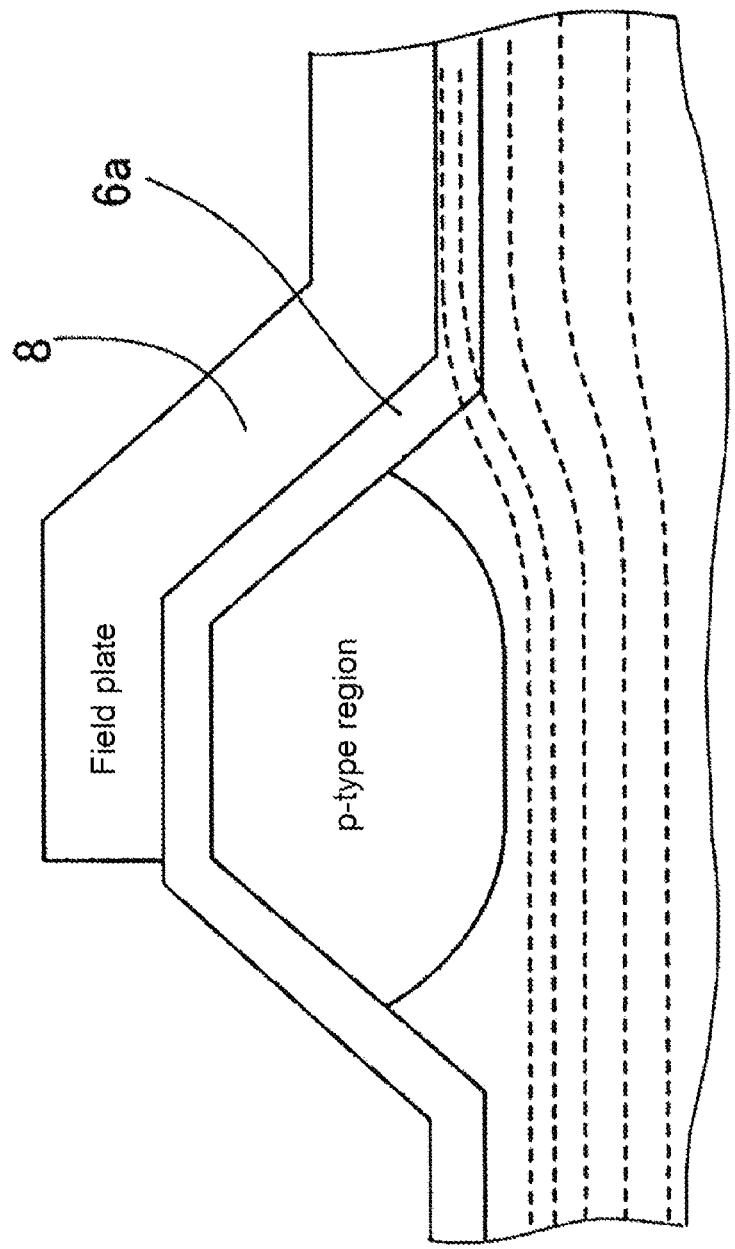
FIG. 3 is an expanded cross sectional view of a guard ring section according to the first embodiment of the semiconductor device of the invention.

FIG. 3 is an expanded cross sectional view of a guard ring section according to the first embodiment of the semiconductor device of the invention. Due to the dielectric permeability difference between the semiconductor substrate 1 and an oxide film (field oxide film) 6a, the distances between the equipotential curves in the oxide film 6a are liable to be short, as shown in FIG. 3, with the electric field strength especially liable to rise under the protruding guard ring side wall. Since the electric field localization in the oxide film 6a exerts the influence thereof on the semiconductor substrate 1 surface too, the breakdown voltage may be lowered by the avalanche breakdown caused in the semiconductor substrate 1 surface.

Figure 4:
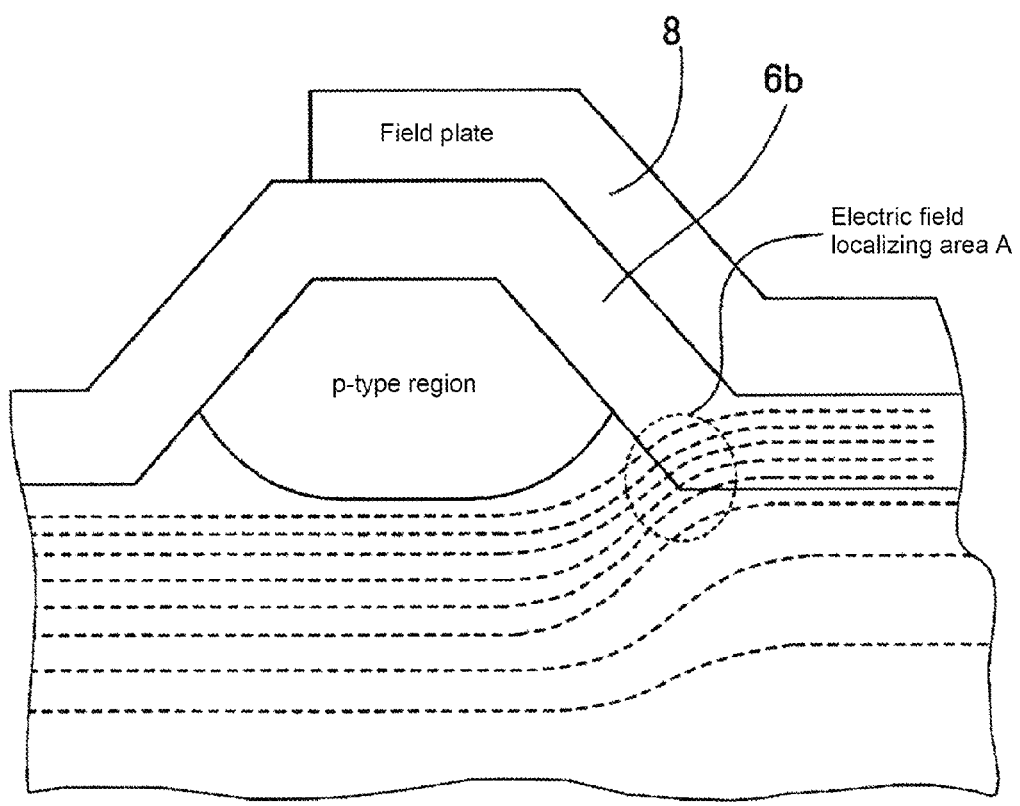
FIG. 4 is an expanded cross sectional view of the guard ring section according to the first embodiment of the semiconductor device of the invention for comparing the oxide film thickness with that in FIG. 3.

When the oxide film 6a is thin, the field plate 8 covering the oxide film 6a will function to relax the dense equipotential curve distribution, but when an oxide film (field oxide film) 6b is thick, as shown in FIG. 4, the electric field relaxation effect will be difficult to obtain, an electric field localizing area A will be caused, and the breakdown voltage will be lowered. Because of this, it is preferable to set the oxide film 6b to be 0.5 μm or thinner in thickness so that the electric field relaxation effect by the field plate 8 may be obtained easily.

Also, since it is possible in the invention to easily suppress the lateral extension of the protruding p-type guard ring by selecting the appropriate patterning and etching conditions, the width of one guard ring is set to be narrow. For example, when the concavity side wall formed by the etching using an anisotropic etcher is set to be vertical, it is possible to completely eliminate the lateral extension of the ring-shaped semiconductor protrusion 5 (guard ring) (not illustrated).

Figure 5:
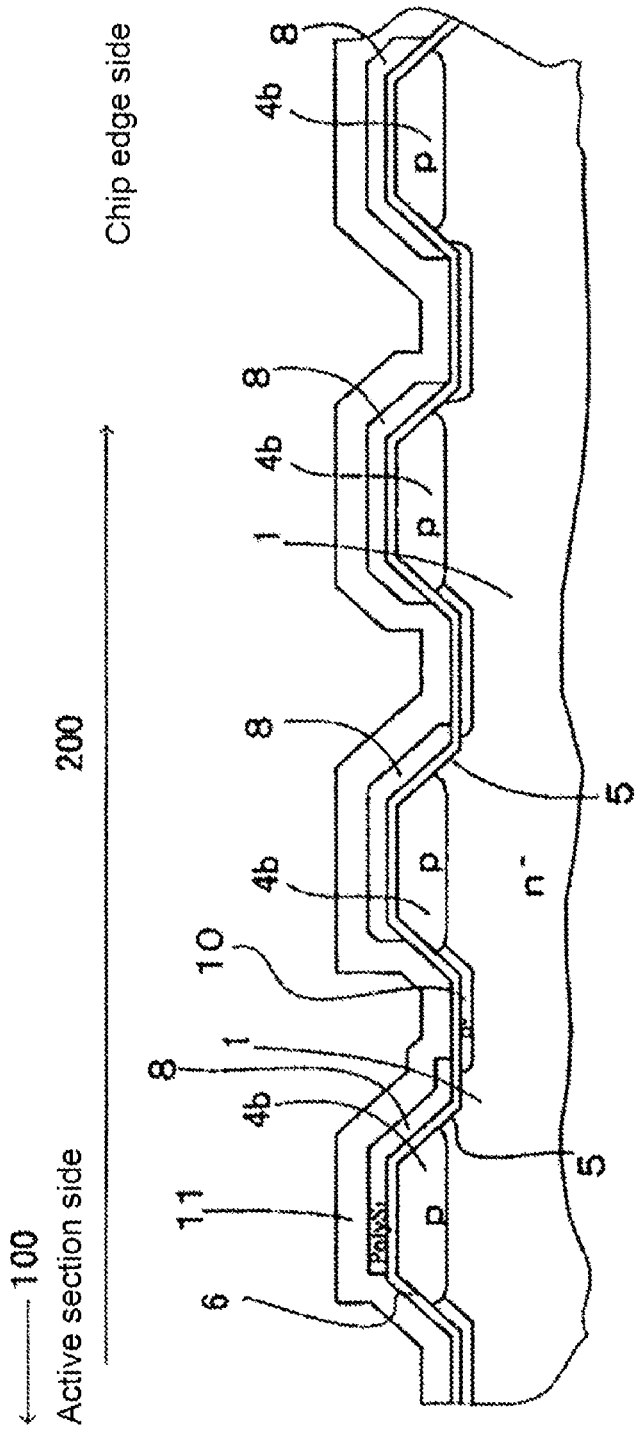
FIG. 5 is a cross sectional view showing the field plate position in the breakdown withstanding section in a 1200V-FS type IGBT according to the first embodiment of the semiconductor device of the invention.

FIG. 5 is a cross sectional view showing the field plate position in the breakdown withstanding section in the 1200V-FS type IGBT according to the first embodiment of the semiconductor device of the invention. By forming a lightly doped p$^-$ region 10 additionally in the concavity surface area in the semiconductor substrate 1 sandwiched by the protruding p-type guard rings, as shown in FIG. 5, the electric field is prevented from localizing. This is because, since the lightly doped p$^-$ region 10 is depleted easily, the average electric field strength is lowered by a so-called RESURF (RESURF effect). Even when the oxide film 6a as thin as 1000 Å (angstroms) is used for the field oxide film, the electric field localization is unlikely to be caused by the extension length variations of the electrically conductive polysilicon field plate 8, and it is possible to prevent the breakdown voltage from dropping.

Since it is possible to omit the step of forming the thick field oxide film 6b and to employ the oxide film 6a, as thin as 0.1 μm and formed simultaneously through the step of forming a gate oxide film 6 in the active section, as the field oxide film, it is possible to reduce the manufacturing costs.

After the semiconductor substrate 1 is dug from the surface thereof in an isotropic manner to a depth of 1.5 μm, the gate oxide film 6 of 800 angstroms (Å) in thickness is grown by thermal oxidation on the one surface side of the semiconductor substrate 1, and an electrically conductive polysilicon layer 7 of 5000 Å (angstroms) in thickness is formed on the gate oxide film 6 (FIG. 8(b)). Subsequently, a portion of the electrically conductive polysilicon layer 7 unnecessary for the field plate 8 is removed by patterning and by etching with a plasma etcher to divide the electrically conductive polysilicon layer 7 (FIG. 8(c)).

The divided electrically conductive polysilicon layers 7 function as the field plate 8. It is preferable to adopt a pattern wherein relative edge positions (X1, X2) of the divided electrically conductive polysilicon layers 7 (that is, the field plates 8) are shifted with respect to the ring-shaped semiconductor protrusions 5 little by little to the inside of the chip, as the divided electrically conductive polysilicon layers are positioned more outward (FIG. 8 (c)).

Now the relative position of the field plate 8 with respect to the ring-shaped semiconductor protrusion 5 will be described below. As shown in FIG. 5, the ring-shaped semiconductor protrusions 5 are formed with an equal space left therebetween and the extending width of the polysilicon field plate 8 from a p-type region 4b is changed by a certain width. For example, a structure is adopted wherein, as the polysilicon field plate 8 is positioned farther away from the active section 100, the edge position of the polysilicon field plate 8 is shifted toward the active section 100 side.

Figure 6:
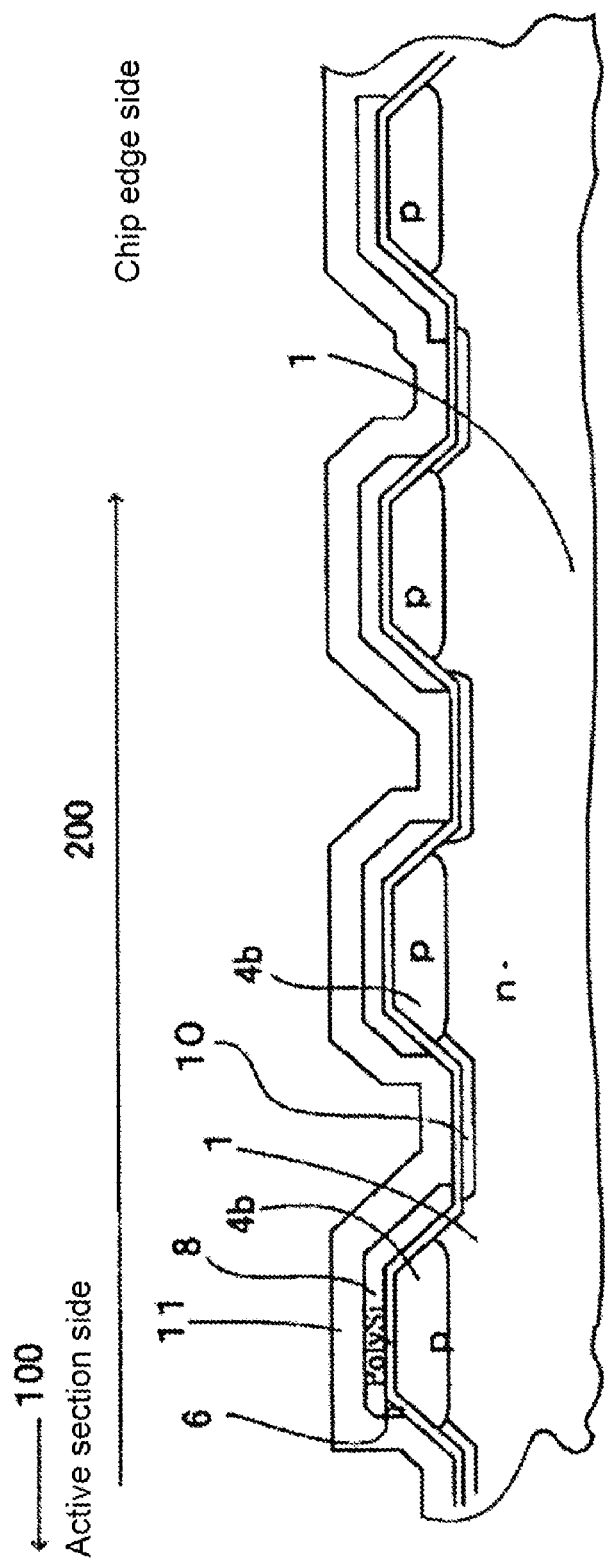
FIG. 6 is a cross sectional view showing mask alignment variations on field plates in the breakdown withstanding section in the 1200V FS-type IGBT according to the first embodiment of the semiconductor device of the invention.

FIG. 6 is a cross sectional view showing mask alignment variations on the field plates in the breakdown withstanding section in the 1200V FS-type IGBT according to the first embodiment of the semiconductor device of the invention. It is also preferable not to change the opening width in the polysilicon field plate 8 but only to shift the opening position toward the active section 100 side, as shown in FIG. 6. The reason for adopting the structures as described above is that the breakdown voltage will be prevented from dropping, even when a mask position variation is caused in the patterning step. For example, even when the mask position variation is caused, a breakdown voltage as high as the originally designed one will be obtained, since the same unit structure as that obtained without causing any mask position variation is obtained at another position.

As it is possible to set the outward extension of the field plate 8 to be wider on the inner peripheral side of the breakdown withstanding section 200, on which the electric field strength tends to be high, by the relative positional relation between the field plate 8 and the ring-shaped semiconductor protrusion 5 being as described above, it is possible to prevent the electric field from localizing. Also, as it is possible to set the inward extension of the field plate 8 to be wider on the outer peripheral side of the breakdown withstanding section 200, on which the electric field strength tends to be low, by the relative positional relation between the field plate 8 and the ring-shaped semiconductor protrusion 5 being as described above, the electric field strength is increased, and the voltage sharing efficiency is improved. As a result, it is possible to reduce the breakdown withstanding section 200 width.

Also, by setting the dividing-position shift-length of the field plate 8 at a certain value (for example, 0.1 μm), the intended structure will be obtained as designed in the ring-shaped semiconductor protrusions 5 adjoining to each other with the concavity interposed therebetween, even when relative positional variations are caused between the polysilicon field plate 8 and the ring-shaped semiconductor protrusion 5 due to the mask position variations. Because of this, it is possible to obtain breakdown voltage performance as designed (FIG. 8(c)).

Next, boron ions are implanted at a small dose amount of $1.0 \times 10^{12}$ cm$^{-2}$ into the one surface side of the semiconductor substrate 1 using the divided electrically conductive polysilicon layers 7 (that is, the field plates 8) as a mask. The dose amount in this case can be selected from a range of $1.0 \times 10^{11}$ cm$^{-2}$ to $1.0 \times 10^{13}$ cm$^{-2}$ (FIG. 9(d)). The lightly doped p$^-$ region 10 formed by the boron ion implantation is depleted by the RESURF effect when an OFF-voltage is applied to the device, and functions to relax the electric field strength.

Next, HTO (High Temperature Oxide) and BPSG (Boro Phospho Silicate Glass) are deposited to a combined thickness of 0.1 μm, on the one surface side of the semiconductor substrate 1 into which the boron ions have been implanted, as an interlayer insulator film 11 (FIG. 9(e)). Subsequently, the HTO and BPSG deposited on the one surface side of the semiconductor substrate 1 are patterned, and after the patterning, the interlayer insulator film 11 is selectively etched by a dry etcher, and a contact hole 12, which has a hole shape such that it can be in simultaneous contact with the field plate 8 and the silicon semiconductor substrate 1, is formed in the curved sections 50 (shown in. FIG. 1) in the breakdown withstanding section 200 (FIG. 10(f)).

For forming the contact hole 12, it is necessary to increase the ring-shaped semiconductor protrusion 5 width and to increase the breakdown withstanding section width. By forming the contact hole 12 only in the curved sections 50 in the chip four corners, it is possible to reduce the breakdown withstanding section width (leave the width as it is) in the straight sections 51 other than the curved sections 50 in the breakdown withstanding section 200. This is because, in the curved sections 50, it is possible to widen the breakdown withstanding section 200 without enlarging the chip size.

FIG. 10 (f) is a cross sectional view of the curved section 50 in the chip corner after an aluminum film is deposited by sputtering. Furthermore, it is preferable to implant boron ions into the curved section 50 at a dose amount of $3.0 \times 10^{15}$ cm$^{-2}$ and at an acceleration energy of 80 keV using the interlayer insulator film 11 as a mask. The reason is that, by forming a heavily doped p$^+$ region 13 under a contact opening of the contact hole 12 in the curved section 50 in the chip corner, the latch-up withstanding capability of the cell in the active section 100 is improved.

An Al—Si electrode film is grown by sputtering, and a metal electrode 14 is formed by patterning and etching the Al—Si electrode film. On forming the metal electrode 14 in a portion of the breakdown withstanding section 200 and contacting with the silicon semiconductor substrate 1, the metal electrode 14 works to neutralize moveable electric charges accumulated in the vicinity of the electrode, while the device is used, and exhibits an effect of suppressing the electric charge accumulation. Therefore, it is possible to suppress the breakdown voltage lowering caused by the moveable electric charges. Furthermore, polyimide is spin-coated to form a surface protector film, and openings are formed only in electrode pad portions of the surface protector film by patterning and etching to form an emitter pad structure and a gate pad structure.

Next, the back surface of the semiconductor substrate 1 is removed by grinding (polishing) to set a wafer to be 120 μm in thickness. Phosphorus ions and boron ions are implanted into the back surface of the wafer set to be 120 μm in thickness, forming an n-type buffer layer and a p-type collector layer. The wafer process is completed by finally forming a four-layered film structure consisting of an aluminum film, a titanium film, a nickel film, and a gold film by sputtering on the back surface of the wafer on which the n-type buffer layer and the p-type collector layer are formed to form a collector electrode. Chips of the 1200V FS-type IGBT 301 are completed by cutting the wafer into chip sizes.

By biasing the collector at a potential higher than the emitter potential in the state in which the gate and the emitter are biased at the same potential, a depletion layer expands from the junction between the p-type base region in the active section 100 and the semiconductor substrate 1 to sustain the applied voltage. At the same time, the depletion layer expands into the breakdown withstanding section 200 from the inner peripheral side thereof to the outer peripheral side thereof to sustain the applied voltage. Due to the electric field relaxation effect that the lightly doped p$^-$ region 10 exhibits, it is possible to prevent the electric field from localizing, and thus possible to secure a high breakdown voltage.

As described above, the protruding p-type guard ring structure and the lightly doped p$^-$ region facilitate preventing the electric field from localizing in the narrow breakdown withstanding section manufactured with low costs, and it is thus possible to prevent the breakdown voltage lowering caused by the process variations from occurring.

Second Embodiment

Now a semiconductor device according to a second embodiment of the invention will be described below. The breakdown withstanding section in the semiconductor device is described in the first embodiment, and in the second embodiment, the semiconductor device includes the breakdown withstanding section described in the first embodiment. The second embodiment relates in particular to the active section of the invention. In the second embodiment, hereinafter, a description will be given of the MOS structure in the active section thereof, unless indicated otherwise. In the second embodiment, in the same manner as in the first embodiment, a description will be given with the FS-IGBT exhibiting a rated breakdown voltage of 1200V as an example. The FS-IGBT, which is the semiconductor device of the second embodiment, has an n-type FZ silicon semiconductor substrate, the major surface of which is a (100) plane and the resistivity of which is 60 Ωcm, as a material.

Figure 12:
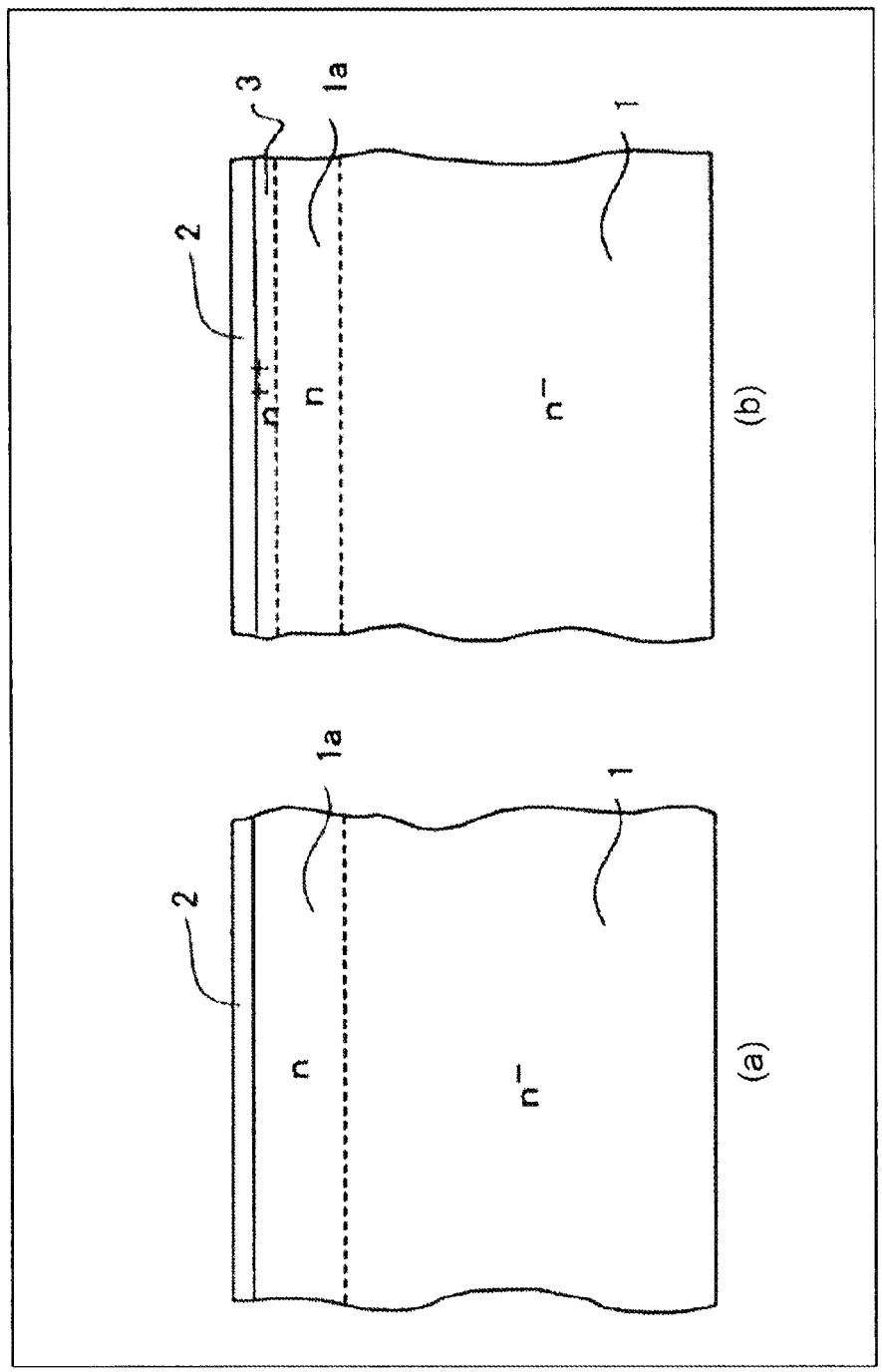
FIG. 12 is cross sectional views of an active section and the vicinity thereof in a main manufacturing step according to a second embodiment of the semiconductor device of the invention, wherein (a) is a (first) manufacturing step and (b) is a (second) manufacturing step.
Figure 13:
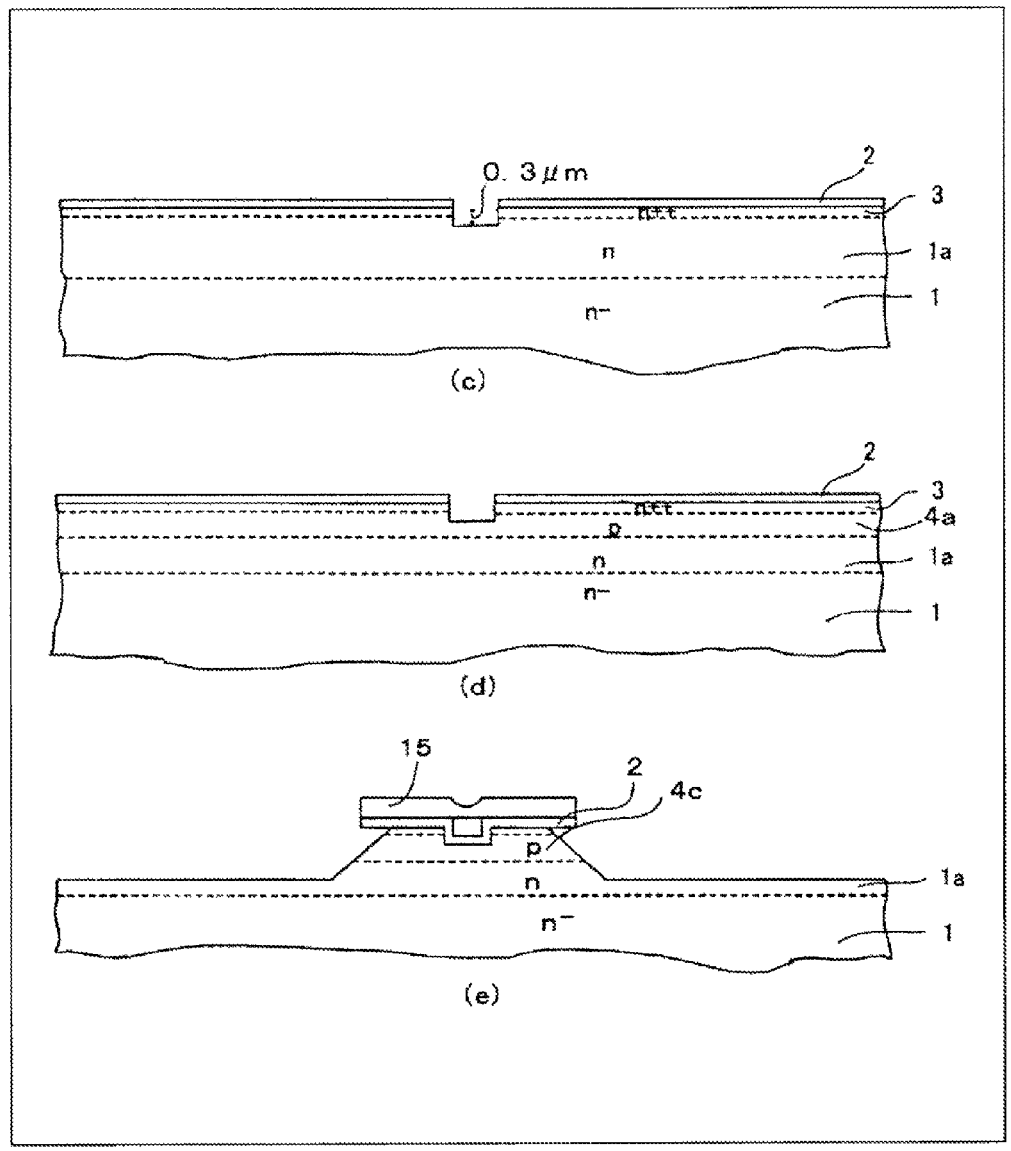
FIG. 13 is cross sectional views of the active section and the vicinity thereof in the main manufacturing step according to the second embodiment of the semiconductor device of the invention, wherein (c) is a (third) manufacturing step, (d) is a (fourth) manufacturing step, and (e) is a (fifth) manufacturing step.

FIG. 12 is cross sectional views of the active section and the vicinity thereof in a main manufacturing step according to the second embodiment of the semiconductor device of the invention, wherein (a) is a (first) manufacturing step and (b) is a (second) manufacturing step. FIG. 13 is cross sectional views of the active section and the vicinity thereof in the main manufacturing step according to the second embodiment of the semiconductor device of the invention, wherein (c) is a (third) manufacturing step, (d) is a (fourth) manufacturing step, and (e) is a (fifth) manufacturing step.

Figure 14:
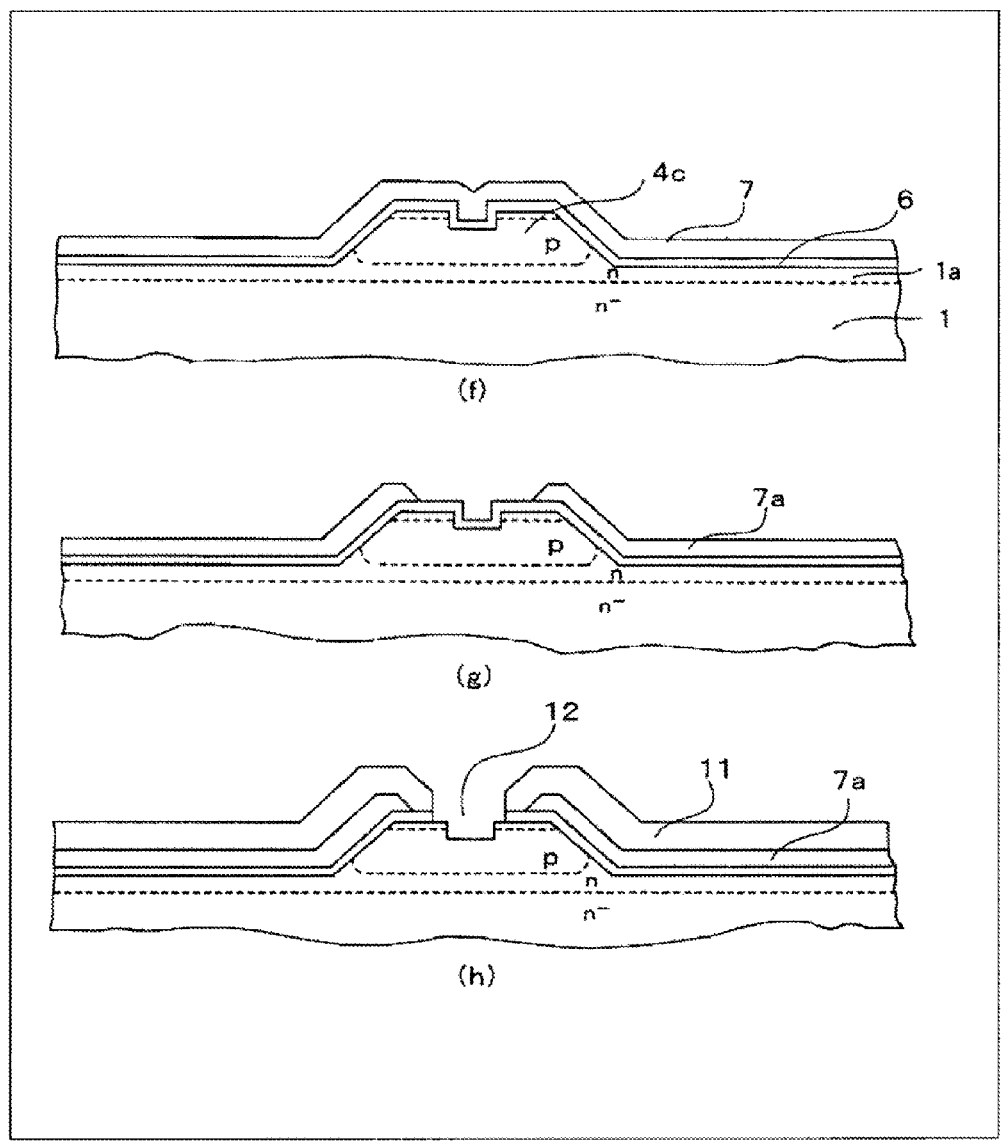
FIG. 14 is cross sectional views of the active section and the vicinity thereof in the main manufacturing step according to the second embodiment of the semiconductor device of the invention, wherein (f) is a (sixth) manufacturing step, (g) is a (seventh) manufacturing step, and (h) is an (eighth) manufacturing step.
Figure 15:
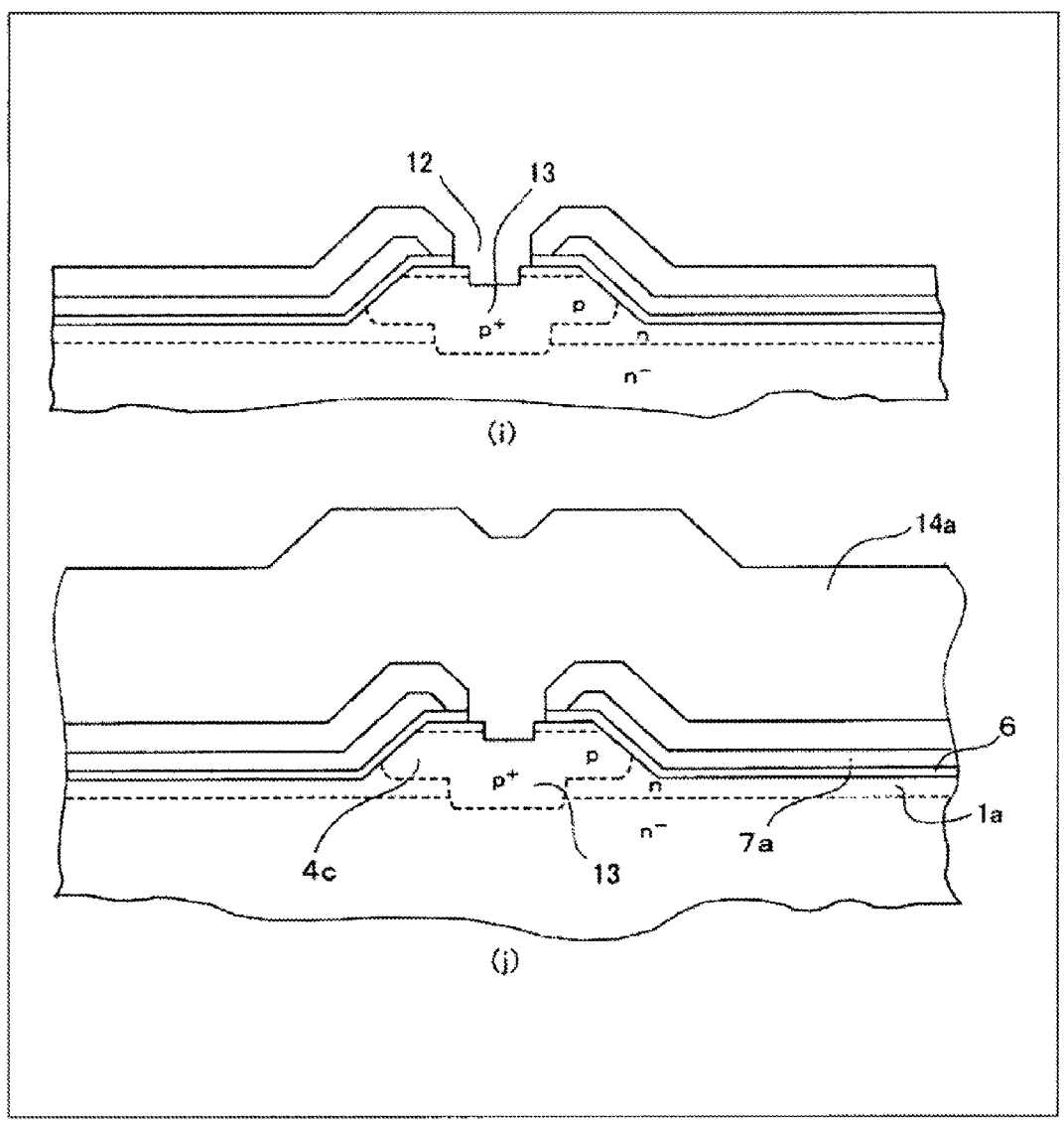
FIG. 15 is cross sectional views of the active section and the vicinity thereof in the main manufacturing step according to the second embodiment of the semiconductor device of the invention, wherein (i) is a (ninth) manufacturing step, and (j) is a (tenth) manufacturing step.

FIG. 14 is cross sectional views of the active section and the vicinity thereof in the main manufacturing step according to the second embodiment of the semiconductor device of the invention, wherein (f) is a (sixth) manufacturing step, (g) is a (seventh) manufacturing step, and (h) is an (eighth) manufacturing step. FIG. 15 is cross sectional views of the active section and the vicinity thereof in the main manufacturing step according to the second embodiment of the semiconductor device of the invention, wherein (i) is a (ninth) manufacturing step, and (j) is a (tenth) manufacturing step.

Firstly, as shown in the cross sectional view of FIG. 12(a), a thermal oxide film 2, 350 Å (angstroms) in thickness, is grown in the surface of a semiconductor substrate 1, phosphorus ions are implanted into one surface side of the semiconductor substrate 1 on which the thermal oxide film 2 has been grown at a dose amount of $1.0 \times 10^{13}$ cm$^{-2}$ and at an acceleration energy of 100 keV, and an n-type layer 1a, the surface impurity concentration of which is intermediate, is formed by thermal diffusion. Next, arsenic ions are implanted at a dose amount of $4.0 \times 10^{15}$ cm$^{-2}$ and at an acceleration energy of 120 keV to form an n$^{++}$ layer that will be a heavily doped n-type emitter region 3 (FIG. 12(b)).

Patterning is conducted on the semiconductor substrate 1 in which the n$^{++}$ layer has been formed, by photolithography, a part of the surface oxide film 2 is removed by dry etching and, after peeling off a resist, the semiconductor substrate 1 surface is etched using the oxide film 2 as a mask to form a concavity, 0.3 µm in depth (FIG. 13(c)).

Since the junction depth of the emitter region 3 is around 0.2 µm, the concavity, 0.3 µm in depth, is deep enough to penetrate the emitter region 3. The concavity is used to form a p$^+$ region 13 for a contact (FIG. 15(i)) in a later step. When a cell structure, a surface pattern of which when observing the semiconductor substrate 1 from above is stripe-shaped, is employed for a fundamental cell (unit MOS structure), it is preferable for the concavity to be shaped with a stripe or to be formed of a plurality of rectangles aligned discontinuously along the extending direction of a stripe. When the fundamental cell is of a round cell structure when observing the semiconductor substrate 1 from above, it is preferable for the concavity to have a round pattern too.

Next, boron ions are implanted at a dose amount of $9.0 \times 10^{13}$ cm$^{-2}$ and at an acceleration energy of 150 keV into the surface of the semiconductor substrate 1, in whose surface the concavity 0.3 µm in depth has been formed by etching, to form a p-type semiconductor layer 4a, around 1 µm in depth (FIG. 13(d)). Then, after the patterning for masking the cell structure is conducted, using a resist mask 15, to form a convex cell structure (a convexity) that includes the concavity in the convexity top center, the exposed semiconductor substrate 1 surface is dug by etching to a depth of 1.5 µm by an isotropic plasma etcher (FIG. 13(e)).

Since the p-type semiconductor layer 4a is 1 µm in depth, while the etching depth is 1.5 µm, the p-type semiconductor layer 4a in the exposed portion (concavity) not covered by any mask is removed completely, as shown in FIG. 13(e), and the n-type layer 1a comes out in the concavity bottom. The protruding p-type semiconductor layer that remains unetched is employed for a p-type base region 4c. Also, hereinafter, the protruding (convex) structure including the p-type base region 4c will be referred to as the "protruding cell structure".

When the etching depth exceeds 2 µm, it is not preferable as resist coating variations will be caused in the succeeding patterning step, and there is a problem in that the patterning dimensional accuracy will be impaired. Therefore, it is preferable to set the etching depth of the semiconductor substrate 1 surface to be less than 2 µm.

Also, as the flat top area of the protruding cell structure after the etching reflects the p-type base region 4c area and the concavity bottom area reflects the n-type layer 1a area except the p-type base region area, the flat top area of the protruding cell structure is narrower, but the ratio of the p-type base region 4c area to the n-type layer 1a area is smaller and the IE effect is improved. Therefore, it is preferable to design the flat top area of the convexity to be smaller than the concavity bottom area. Further, by narrowing the convexity surface and the concavity bottom simultaneously, while keeping the ratio of the flat top area of the convexity to the concavity bottom area at a certain value, it is possible to shorten the cell pitch.

Also, by bringing some p-type base regions 4c in a plurality of protruding cell structures into an electrically floating state (by forming floating p-type layers) instead of narrowing the flat top area of the convexity, it is possible to improve the IE effect. This is because the floating p-type layer potential rises in the steady ON-state, the forward bias voltage of the junction between the floating p-type layer and the n-type drift layer rises, and the carrier concentration increases.

Since it is possible with the structure described above to narrow the surface electron layer width while keeping the high IE effect, it is possible to reduce the voltage drop in the surface electron layer, and thus possible to lower the ON-voltage. The angle between the side wall of the protruding cell structure formed by etching and the surface (flat top) thereof can be controlled by the boron dose amount for forming the p-type base region 4c, the degree of the subsequent annealing, and the etching conditions.

When the angle between the flat top and the side wall of the convexity is too wide, the p-type base region 4c area will be too wide, even when the flat top surface area is narrow, and the IE effect will be impaired. Therefore, it is preferable for the angle between the flat top and the side wall to be 150 degrees of angle or less, and more preferable the closer the angle is to 90 degrees of angle.

Next, as shown in FIG. 14(f), a gate oxide film 6, 800 Å (angstroms) in thickness, is grown thermally at 900° C. At the same time, the boron layer (p-type base region 4c) is annealed. Further, a polysilicon layer 7, 0.5 µm in thickness, is deposited. A polysilicon gate electrode 7a is formed by patterning and by etching with an isotropic plasma etcher (FIG. 14(g)). An HTO (High Temperature Oxide) film and a BPSG (Boro Phospho Silicate Glass film are deposited sequentially to form an interlayer insulator film 11 on the semiconductor substrate 1 on which the polysilicon gate electrode 7a has been formed, after which, a contact hole 12 is formed by patterning and etching (FIG. 14(h)).

Next, a screen oxide film (not shown) of 150 Å (angstroms) is formed by a thermal treatment in an oxygen atmosphere, and boron ions are implanted into the contact hole 12 by the self-alignment technique at a dose amount of $1.0 \times 10^{15}$ cm$^{-2}$ and at an acceleration energy of 80 keV. Subsequently, annealing is conducted at 1000° C. for 30 minutes in a nitrogen atmosphere to form the p$^+$ region 13 for a contact. (FIG. 15(i)). After the p$^+$ region 13 for a contact is formed, the screen oxide film is removed, and after the removal of the screen oxide film, an Al—Si surface electrode film 14a is deposited by sputtering, and an emitter electrode pattern and a gate electrode pattern are formed by patterning and etching. (FIG. 15(j)).

After forming the emitter electrode pattern and the gate electrode pattern, polyimide is spin-coated as a surface protector film, and a pattern for exposing the bonding pad areas for the emitter electrode and the gate electrode is formed by patterning and etching (subsequent steps are not shown). The back surface of the semiconductor substrate 1 is removed by grinding to reduce the wafer thickness to 120 μm.

Protons and boron ions are implanted into the wafer back surface reduced to 120 μm and, after implanting the protons and the boron ions, an n-type buffer layer and a p-type collector layer (neither shown) are formed by a thermal treatment at 400° C. Finally, a collector electrode film formed of a four-layered film structure consisting of an aluminum film, a titanium film, a nickel film, and a gold film is formed by sputtering on the wafer back surface on which the n-type buffer layer and the p-type collector layer are formed, thus completing the wafer process. Chips of the 1200V-FS-IGBT are completed by cutting the wafer into chip sizes.

By biasing the collector at a potential higher than the emitter potential in the state in which the gate and the emitter are biased at the same potential, a depletion layer expands from the junction between the p-type base region 4c in an active section 100 and the n-type FZ silicon semiconductor substrate (n$^-$ drift layer) 1, blocking the applied voltage and bringing the device into the OFF-state thereof. By biasing the collector at a potential higher than the emitter potential in the state in which the gate is biased at a high potential equal to or higher than the emitter potential and a threshold voltage, electrons flow into the bulk (n$^-$ drift layer 1) through an n-type inversion layer (channel) caused in the silicon substrate opposing the gate electrode via the gate oxide film, and reach a back surface collector electrode through a back-surface-side collector pn-junction. From the back-surface-side pn-junction, holes are injected, and the holes reach the back surface p-type base region and are extracted to the emitter electrode. As a result, a conductivity modulation is caused in the bulk, the resistance becomes low, and it is possible to cause a large current to flow (ON-state).

In the heretofore described IGBT according to the invention, the pitch in the cell structure, which is the unit MOS structure, is shorter than that in the conventional IGBT. Because of this, the electron storage layer length (distance in the current flow direction) is short and the electron current density is small. As a result, the voltage drop in the electron layer can be reduced.

Also, since the ratio of a pnp-BJT (Bipolar Junction Transistor) region is small, the IE effect is very high, and a high-carrier-density region occupies the most part of the active section. Therefore, the electrical resistance in the n$^-$ drift layer 1 is reduced, and the ON-voltage is lowered. Especially, the voltage drop in the n$^-$ drift layer 1 that sustains a large part of the ON-voltage share in the IGBT exhibiting a high breakdown voltage can be minimized (at a certain turnoff loss).

Next, a description will be given of a blocking mode of operations, wherein the gate potential of the IGBT according to the second embodiment of the invention is set to be the same or negative with respect to the emitter potential, and a forward bias voltage is applied between the collector and the emitter. At the same time as a depletion layer expands from the pn-junction between the p-type base layer 4c and the n$^-$ drift layer 1, a depletion layer expands also from the gate oxide film 6. This because the gate electrode 7a is biased almost at the emitter potential but the n$^-$ drift layer 1 is biased at a positive potential. Since the region in which the n-type layer 1a and the gate oxide film 6 contact with each other is flat, the area thereof is narrow. Therefore, the capacitance between the gate and the collector is reduced and the switching operations are conducted quickly.

Furthermore, since the depletion layer expands more flatly in the IGBT according to the invention as compared with the planar-gate structure and the trench-gate structure, it is possible to suppress the local electric field strength peak, and it is thus difficult for a local avalanche breakdown to occur. Therefore, it is possible to secure a sufficiently high breakdown voltage. As a result, the breakdown voltage is improved as compared with the conventional planar-gate IGBT or with the conventional trench-gate IGBT. Conversely, it is possible to reduce the wafer thickness for obtaining the same breakdown voltage, and it is thus possible to further reduce the ON-voltage.

In the IGBT according to the embodiment described above, it is possible to increase the IE effect and reduce the ON-voltage. Also, it is possible to prevent a local electric field localization from occurring at the time of sustaining the voltage and obtain a high breakdown voltage. The parasitic capacitance is kept low, and quick switching operations are realized.

Third Embodiment

Figure 18:
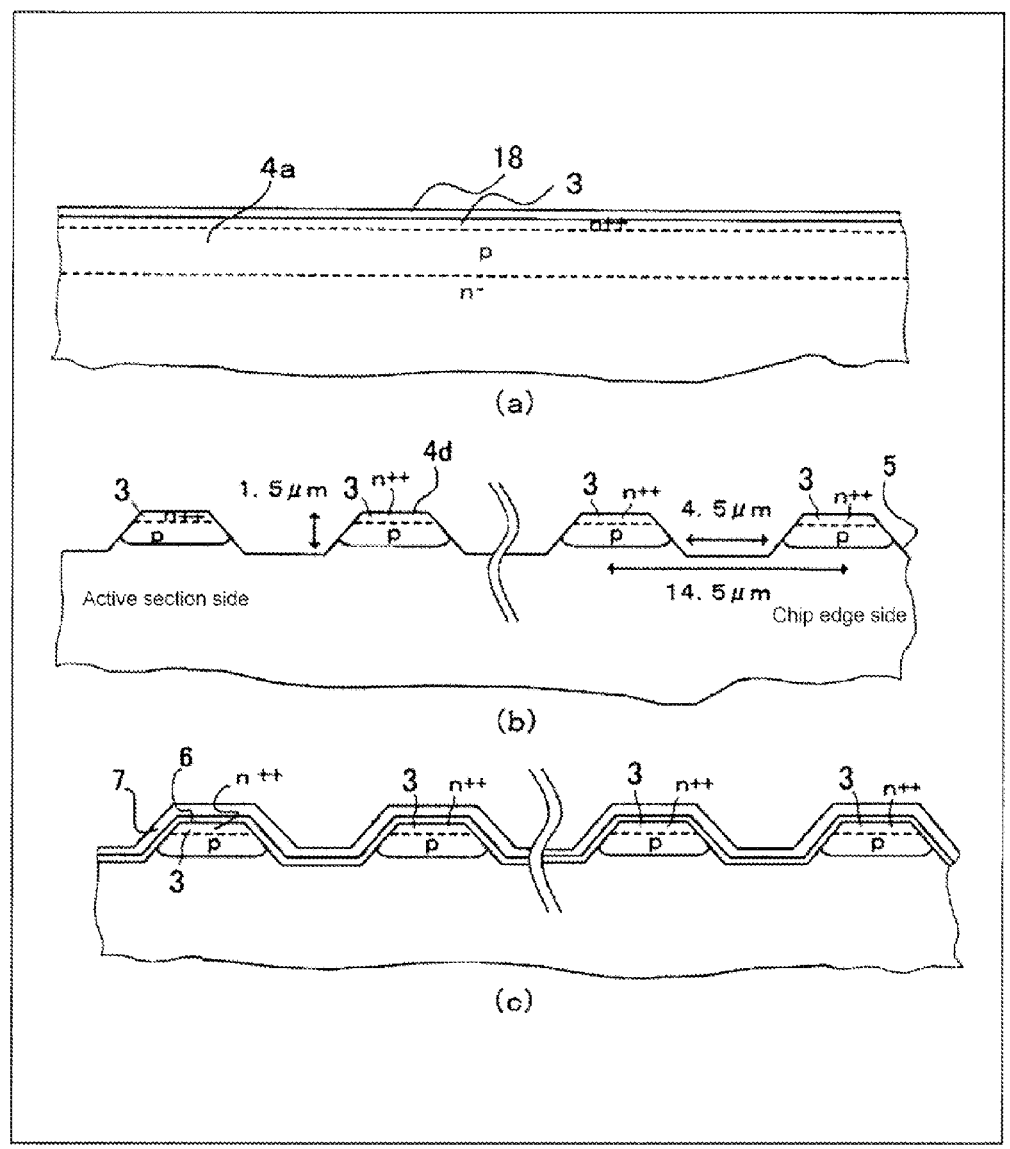
FIG. 18 is cross sectional views of a breakdown withstanding section in a main manufacturing step according to a third embodiment of a semiconductor device manufacturing method of the invention, wherein (a) is a (first) manufacturing step, (b) is a (second) manufacturing step, and (c) is a (third) manufacturing step.

Hereinafter, a description will be given of a third embodiment of the semiconductor device of the invention. FIG. 18 is cross sectional views of a breakdown withstanding section in a main manufacturing step according to the third embodiment of a semiconductor device manufacturing method of the invention, wherein (a) is a (first) manufacturing step, (b) is a (second) manufacturing step, and (c) is a (third) manufacturing step.

In the third embodiment relating to the semiconductor device manufacturing method of the invention, a description will be given using the FS-type IGBT that exhibits a rated breakdown voltage of 1200V, also described in the second embodiment. The third embodiment relates to the improvement of the photolithographic step in forming the breakdown withstanding section of the IGBT described above. The FS-IGBT that is the semiconductor device of the third embodiment, in the same manner as according to the first and the second embodiments, has the n-type FZ silicon substrate, the major surface of which is a (100) plane and the resistivity of which is 60 Ωcm, as a material.

Firstly, a thermal oxide film (omitted from the drawing), 350 Å (angstroms) in thickness, is grown on the surface of a semiconductor substrate 1, and arsenic ions are implanted into the surface of the semiconductor substrate 1 on which the thermal oxide film has been grown at a dose amount of 4.0× $10^{15}$ cm$^{-2}$ and at an acceleration energy of 120 keV to form a heavily doped n-type emitter layer 3. For the breakdown withstanding section, the n-type emitter layer 3 is unnecessary, but the n-type emitter layer 3 is necessary to form a MOS structure in an active section.

Next, crystal defects are recovered, and at the same time a screen oxide film 18 is formed, by removing the thermal oxide film entirely and by annealing in an oxygen atmosphere at 1000° C. Boron ions are implanted into the surface of the semiconductor substrate 1 on which the screen oxide film 18 has been formed at a dose amount of 9.0×10$^{13}$ cm$^{-2}$ and at an acceleration energy of 150 keV to form a p-type layer 4a that will be a p-type base region 4c (FIG. 18(a)).

After the screen oxide film is removed entirely, a plurality of stripes of ring shaped resist films (not shown), spaced apart from each other for an equal distance, that work as an etching mask are formed by patterning, in order to form by etching ring-shaped semiconductor protrusions 5 that will be guard rings 4d in the breakdown withstanding section. As the opening width and the pitch in the resist film are 4.5 µm and 14.5 µm, respectively, the mask is 10 µm in width.

Next, the silicon substrate is isotropically etched by a plasma etcher from the exposed surface thereof, not covered by the resist mask, to a depth of 1.5 µm. When looking at the semiconductor substrate 1 from above after the resist mask is removed, a structure that includes many stripes of the ring-shaped semiconductor protrusions 5 represented by broken curves, as shown in FIG. 11, and spaced apart from each other for an equal distance is formed, and the ring-shaped protruding p-type guard rings 4d are formed (FIG. 18(b)).

After forming the p-type guard rings 4d, a gate oxide film 6 of 800 Å (angstroms) in thickness is grown by thermal oxidation, and a polysilicon layer 7 of 5000 Å (angstroms) in thickness is grown on the gate oxide film 6 that has been grown (FIG. 18(c)). When coating with a resist 16 for the patterning of the polysilicon layer 7, a resist thickness (T1) on a convexity top and a resist thickness (T2) on a concavity bottom are different from each other, since the semiconductor substrate is uneven (FIG. 19(d)).

Figure 16:
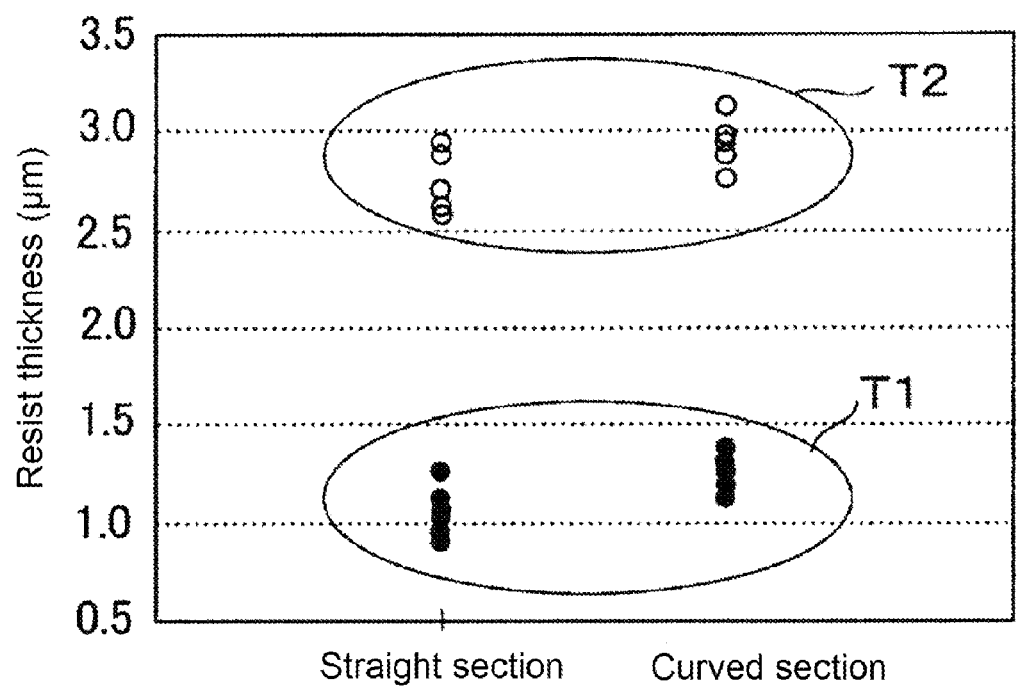
FIG. 16 is a relationship diagram for the resist thickness and the resist-free width of straight and curved sections in a convexity T1 and a concavity T2 of a breakdown withstanding section in a 1200V-FS type IGBT according to the second embodiment of the semiconductor device of the invention.

Next, a description will be given of the relationship between the resist thickness and the resist-free width of straight and curved sections in the convexity T1 and the concavity T2 of the breakdown withstanding section in the 1200V-FS type IGBT. FIG. 16 is a relationship diagram for the resist thickness and the resist-free width of the straight and curved sections in the convexity T1 and the concavity T2 of the breakdown withstanding section in the 1200V-FS type IGBT according to the second embodiment of the semiconductor device of the invention.

FIG. 16 shows the results of measuring the resist thicknesses T1 and T2 when the resist is actually spinner coated on the wafer on which the striped ring-shaped semiconductor protrusions 5 are formed. Also, FIG. 16 shows the relationship between the resist thickness and the resist-free width of the straight and curved sections in the convexity T1 and the concavity T2 of the breakdown withstanding section in the 1200V-FS type IGBT when an average value of T1 in a straight section 51 in FIG. 11 is about 1.2 µm, and an average value of T2 is about 2.7 µm. According to FIG. 16, it can be seen that the step height 1.5 µm of the stripe of ring-shaped semiconductor protrusions 5 is equal to the difference 1.5 µm between the resist thicknesses T1 and T2 in the straight section 51. Furthermore, in FIG. 16, it is indicated also that the resist thicknesses T1 and T2 in a curved section 50 are each larger than in the straight section 51 of FIG. 11 by about 0.2 µm.

Figure 19:
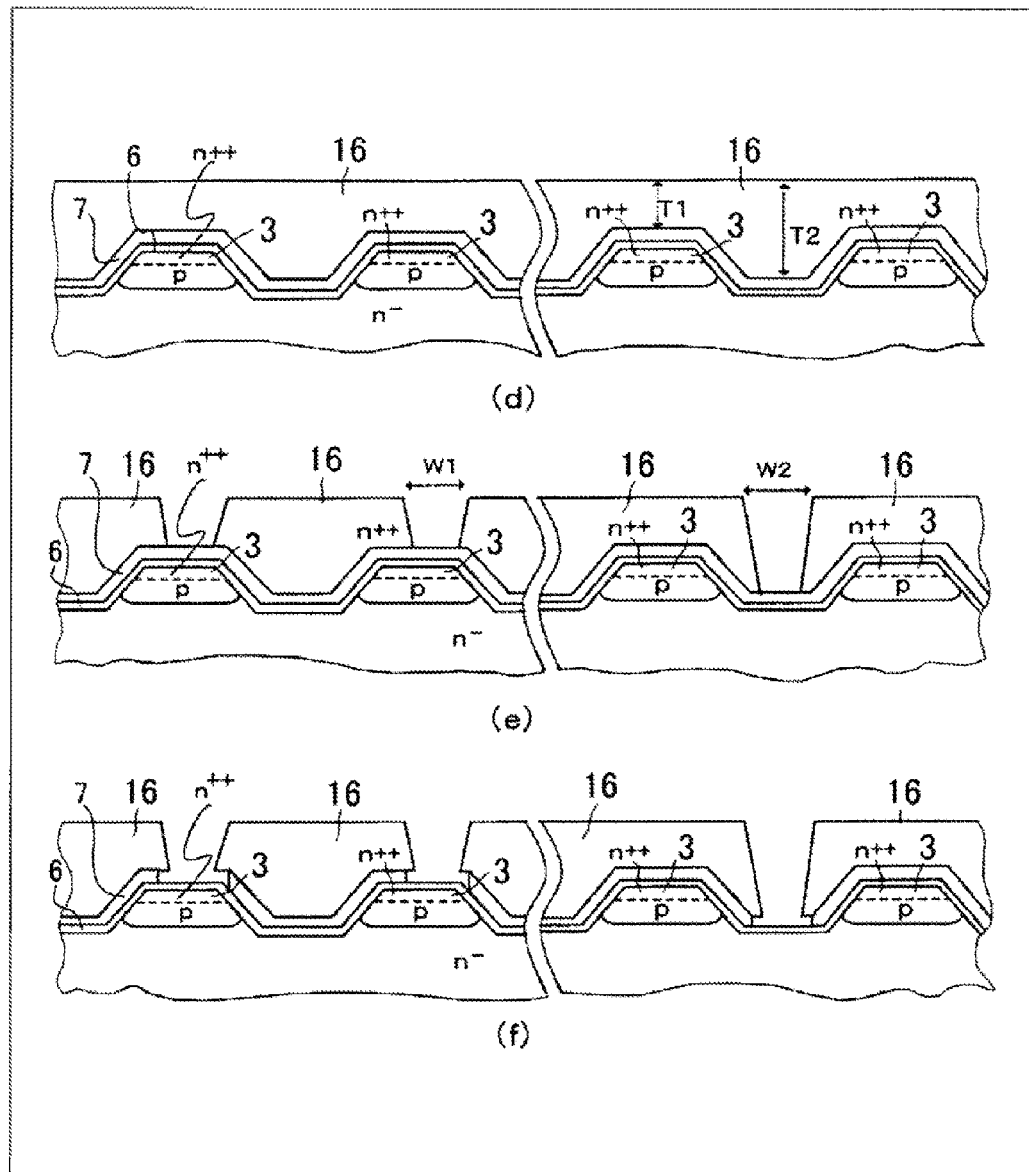
FIG. 19 is cross sectional views of the breakdown withstanding section in the main manufacturing step according to the third embodiment of the semiconductor device, and manufacturing method thereof, of the invention, wherein (d) is a (fourth) manufacturing step, (e) is a (fifth) manufacturing step, and (f) is a (sixth) manufacturing step.

Next, a description will be given of the breakdown withstanding section in a main manufacturing step according to the third embodiment of the semiconductor device, and the manufacturing method thereof, of the invention. FIG. 19 is cross sectional views of the breakdown withstanding section in the main manufacturing step according to the third embodiment of the semiconductor device, and the manufacturing method thereof, of the invention, wherein (d) is a (fourth) manufacturing step, (e) is a (fifth) manufacturing step, and (f) is a (sixth) manufacturing step.

As shown in FIG. 19(e), a pattern is adopted in which the relative position of the resist-free position (opening) in the resist film applied on the wafer surface is shifted as the opening is positioned more closely to chip edge side, as described in the first embodiment. Therefore, as a resist-free position (opening) provided on the flat top of the ring-shaped semiconductor protrusion 5 on the inner peripheral side of the breakdown withstanding section shifts to the concavity bottom on the breakdown withstanding section outside the chip, when a resist thickness difference such as between T1 and T2 exists, the resist opening widths will differ (hereinafter referred to as variations), as can be seen from FIG. 17.

Figure 17:
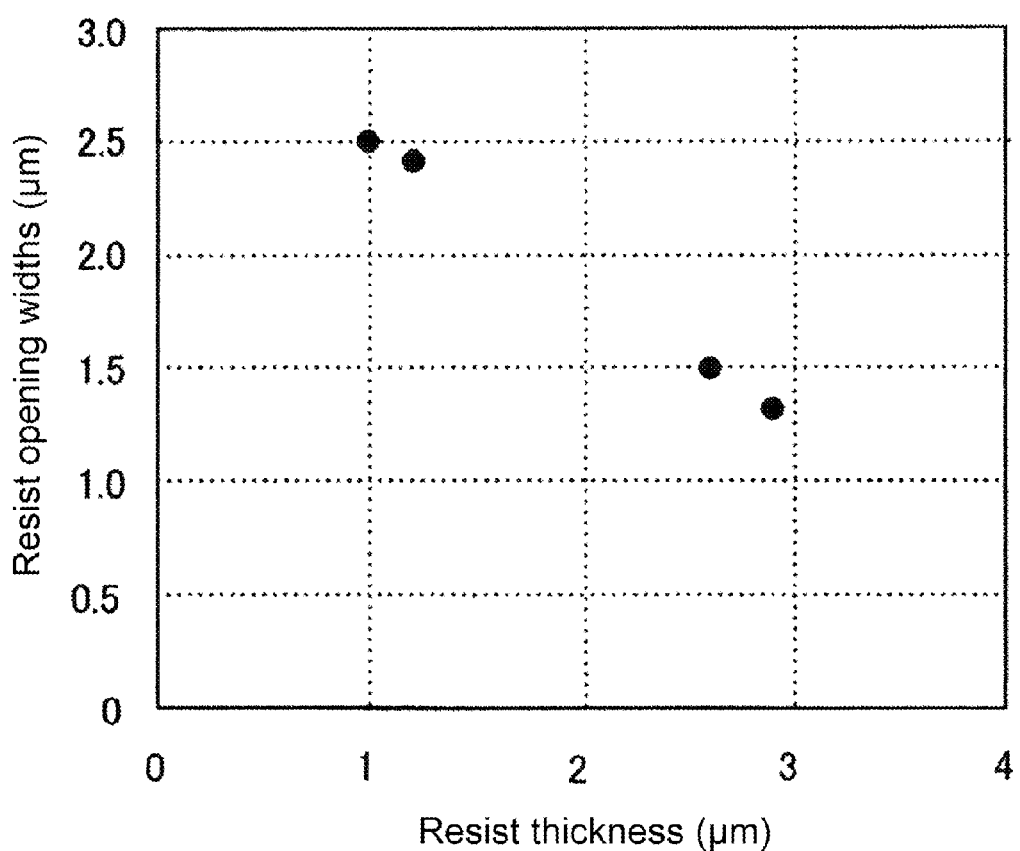
FIG. 17 is a relationship diagram for the resist thickness and the resist-free width (opening width).

Next, a description will given of the relationship between the resist opening width and the resist thickness. FIG. 17 is a relationship diagram for the resist thickness and the resist-free width (opening width). FIG. 17 shows the relationship between the resist-free width and the resist thickness when the resist-free width mask dimension is 1.5 µm. Further, the effect of the focal depth of the photolithography also causes different opening widths on the bottom and the surface, between which a height difference of 1.5 µm exists. The polysilicon layers 7 divided by removing the polysilicon layer 7 under the resist opening by etching with a plasma etcher function as field plates. Because of this, the resist opening width variations impair the breakdown voltage and the reliability (FIG. 19(f)).

From the relationship between the resist-free width and the resist thickness shown in FIG. 17, it is found that for suppressing the opening width variations caused by the resist thickness difference, it is effective to change the mask size depending on the resist thickness. In detail, the mask resist opening width dimension is such that it is widened at a bottom (W2) by 1.5 µm with respect to a surface (W1), and by 0.2 µm in the curved section with respect to the straight section. Also, by lowering the ring-shaped semiconductor protrusion height (convexity height) relatively to the resist thickness, it is possible to suppress the resist opening width variations.

Furthermore, it is found that when the resist thickness on the concavity bottom is less than twice as large as the ring-shaped semiconductor protrusion height, a large difference will be caused between the opening widths of the resist 16 on the convexity top and in the concavity bottom. Therefore, it can be seen that, when the resist thickness on the concavity bottom is twice or more as large as the convexity height, the difference between the opening widths of the resist 16 will be less than two times, even when the semiconductor substrate surface is uneven relatively, which is effective in suppressing the resist opening width variations (FIG. 20).

Figure 20:
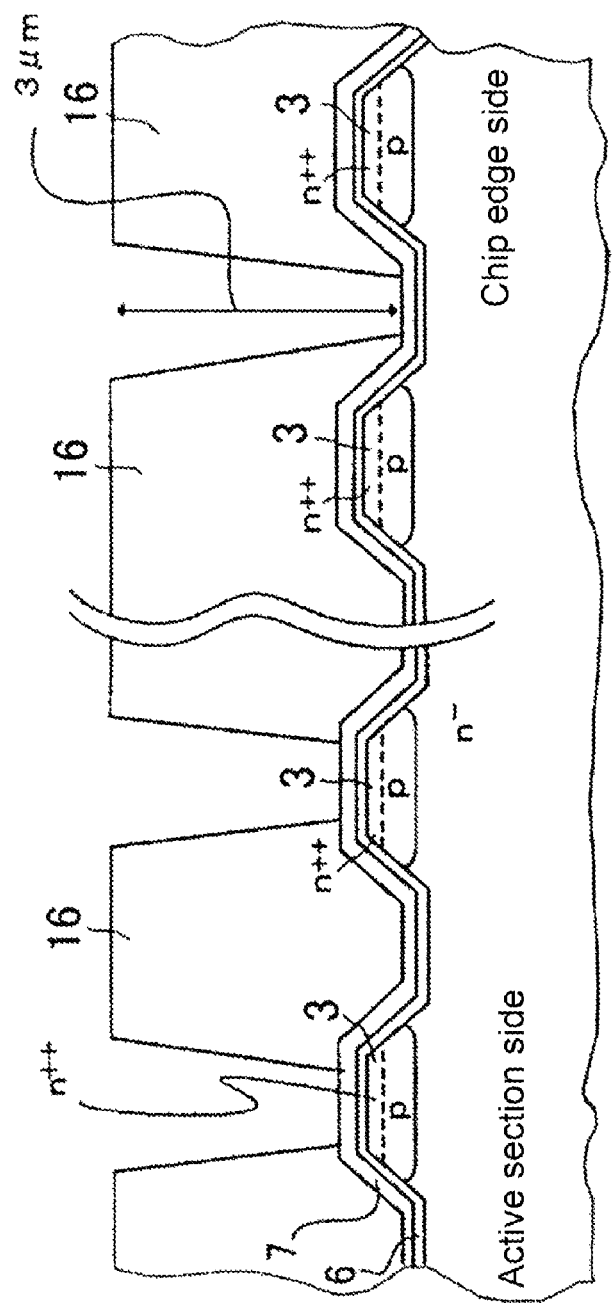
FIG. 20 is a cross sectional view when a resist film applied to the breakdown withstanding section according to the semiconductor device of the invention including steps caused by the unevenness thereon is thicker than the step height.

FIG. 20 is a cross sectional view when a resist film applied to a breakdown withstanding section according to the semiconductor device of the invention including steps caused by the unevenness thereon is thicker than the step height. For setting the resist thickness on the concavity bottom to be twice or more as large as the convexity height, it is effective to increase the resist 16 viscosity.

Fourth Embodiment

Hereinafter, a description will be given of a fourth embodiment relating to the semiconductor device of the invention. In a semiconductor device manufacturing method according to the fourth embodiment, steps as far as the step of depositing the polysilicon layer 7 (FIG. 18(c)) are the same as in the third embodiment. A manufacturing step differing between the third embodiment and the fourth embodiment is the step of changing the resist application from the spinner coating to spray coating for the patterning of the polysilicon layer 7.

By adopting this kind of manufacturing step, it is possible to suppress the resist thickness variations despite the unevenness of the semiconductor substrate 1 surface. In the spray coating method, a resist solution once becomes a mist, when coated on the semiconductor substrate surface, the resist 16 solvent vaporizes, and the resist is applied on the semiconductor substrate surface in the state in which the viscosity thereof is high. As a result, when the resist film is coated uniformly, the resist film on the convexity will not flow to the concavity and a uniform film thickness can be kept, even when the substrate surface is uneven.

FIG. 21 is a cross sectional view of a breakdown withstanding section spray coated with the resist 16. As shown in FIG. 21, as a result of spray coating with the resist 16, it is possible to apply the resist 16 to a uniform film thickness, despite the unevenness of the silicon substrate surface. Therefore, the spray coating is effective in suppressing the resist film thickness variations. The resist 16 opening width variation caused by the focal depth difference can be suppressed by widening W2 (the bottom opening width), when the concavity bottom is brought into focus, and by widening W1 (the surface opening width), when the surface is brought into focus.

INDUSTRIAL APPLICABILITY

As heretofore described, the semiconductor device and the semiconductor device manufacturing method according to the invention are useful in a power semiconductor device used in a power conversion device, or the like, and in particular, are suited to a MOS semiconductor device such as an IGBT, and to a manufacturing method thereof.

The invention claimed is:

1. A semiconductor device, comprising:
an active section engaged in making a main current flow and a breakdown withstanding section, engaged in breakdown voltage, disposed in an external peripheral portion surrounding the active section on one major surface of a first conductivity type semiconductor substrate, wherein
the breakdown withstanding section has a ring-shaped semiconductor protrusion, with a rectangular planar pattern including a curved section in each of four corners thereof, as a guard ring, and
the ring-shaped semiconductor protrusion has a second conductivity type region therein, is sandwiched between a plurality of concavities deeper than the second conductivity type region and, a difference in height between the ring-shaped semiconductor protrusion and the concavities being less than 2 µm, has an electrically conductive film across an insulator film on a surface thereof;
wherein a plurality of ring-shaped semiconductor protrusions are arranged between an active section side and a chip edge side at different distances from the active section side, a plurality of electrically conductive films are formed on each of respective ones of the plurality of ring-shaped semiconductor protrusions, and edges of the plurality of electrically conductive films are positioned closer to the active section side as a distance between a corresponding ring-shaped semiconductor protrusion and the active section side increases.

2. The semiconductor device according to claim 1, wherein the insulator film is 0.5 µm or less in thickness.

3. The semiconductor device according to claim 1, wherein the insulator film on the ring-shaped semiconductor protrusion surface is an oxide film, and the electrically conductive film is an electrically conductive polysilicon layer.

4. The semiconductor device according to claim 3, wherein the oxide film on the ring-shaped semiconductor protrusion surface is formed simultaneously with forming a gate oxide film in the active section.

5. The semiconductor device according to claim 3, further comprising,
in the curved section in the four corners of the ring-shaped semiconductor protrusion, a structure wherein a metal electrode unitary with a main electrode on the active section contacts electrically with the electrically conductive polysilicon layer via an opening provided in an interlayer insulator film covering the electrically conductive polysilicon layer, and further contacts electrically with the first conductivity type semiconductor substrate via an opening provided in the electrically conductive polysilicon layer under the opening and in the interlayer insulator film.

6. The semiconductor device according to claim 5, wherein the metal electrode is an alloy electrode containing aluminum as a main component thereof.

7. The semiconductor device according to claim 1, further comprising a second conductivity type semiconductor region with a dose amount between $1 \times 10^{11}$ cm$^{-2}$ and $1 \times 10^{13}$ cm$^{-2}$ in a bottom of the plurality of concavities sandwiching the ring-shaped semiconductor protrusion.

8. The semiconductor device according to claim 1, wherein a plurality of the ring-shaped semiconductor protrusions are arranged with an equal space therebetween, the electrically conductive films on the ring-shaped semiconductor protrusions are arranged with a space therebetween different from the space between the ring-shaped semiconductor protrusions, and the arrangement of the electrically conductive films is such that a pitch of the space between the electrically conductive films is made to be narrower than a pitch of the space between the ring-shaped semiconductor protrusions by a predetermined width from a chip edge to a chip center with an innermost position of the breakdown withstanding section as a reference.

9. The semiconductor device according to claim 1, wherein the ring-shaped semiconductor protrusion that includes the second conductivity type region further includes a first conductivity type region.

10. The semiconductor device according to claim 1, wherein, of a plurality of concavities and convexities distributed uniformly in the active section, a convexity includes a MOS structure region including an underlying second conductivity type base region, a first conductivity type emitter region with a high impurity concentration on the base region, and a gate electrode above a side surface of the second conductivity type base region exposed to a side wall of the convexity across a gate insulator film, the active section further includes a first conductivity type region in a bottom area of a concavity, and a total flat top area of the MOS structure region in the convexity is smaller than the bottom area of the concavity of the active section.

11. The semiconductor device according to claim 10, wherein the MOS structure region is less than 2 µm in height.

12. The semiconductor device according to claim 11, wherein an angle between a top surface and the side wall of the convexity is 150 degrees or less.

13. The semiconductor device according to claim 2, wherein the insulator film on the ring-shaped semiconductor protrusion surface is an oxide film, and the electrically conductive film is an electrically conductive polysilicon layer.

14. A semiconductor device, comprising:
a substrate of a first conductivity type; and
an active section and a breakdown withstanding section on the substrate;
the breakdown withstanding section including
at least one protrusion having a region of a second conductivity type, and
a concavity on at least one side of the at least one protrusion;
wherein a depth of the concavity in the substrate is greater than a depth of the region of the second conductivity type in the substrate; and
wherein a plurality of ring-shaped semiconductor protrusions are arranged between an active section side and a chip edge side at different distances from the active section side, a plurality of electrically conductive films are formed on each of respective ones of the plurality of ring-shaped semiconductor protrusions, and edges of the plurality of electrically conductive films are positioned closer to the active section side as a distance between a corresponding ring-shaped semiconductor protrusion and the active section side increases.

15. The semiconductor device of claim 14, wherein a difference in height between the at least one protrusion and the concavity is less than 2 μm.

16. The semiconductor device of claim 15, further comprising an insulator film on the at least one protrusion.

17. The semiconductor device of claim 16, further comprising an electrically conductive film on the insulator film.

18. The semiconductor device of claim 17, wherein in a plan view the at least one protrusion forms a perimeter around the active region.

* * * * *